(12) United States Patent
Roper et al.

(10) Patent No.: US 11,118,912 B2
(45) Date of Patent: Sep. 14, 2021

(54) MAGNETIC POSITIONING SYSTEM

(71) Applicant: VITAL ALERT COMMUNICATION INC., Toronto (CA)

(72) Inventors: Michael James Roper, Ottawa (CA); Peter Kwasniok, Dunrobin (CA); Maxim Ralchenko, Nepean (CA)

(73) Assignee: VITAL ALERT COMMUNICATION INC., Toronto (CA)

( * ) Notice: Subject to any disclaimer, the term of this patent is extended or adjusted under 35 U.S.C. 154(b) by 127 days.

(21) Appl. No.: 16/469,389

(22) PCT Filed: Dec. 20, 2017

(86) PCT No.: PCT/CA2017/051554
§ 371 (c)(1),
(2) Date: Jun. 13, 2019

(87) PCT Pub. No.: WO2018/112631
PCT Pub. Date: Jun. 28, 2018

(65) Prior Publication Data
US 2019/0383619 A1    Dec. 19, 2019

Related U.S. Application Data

(60) Provisional application No. 62/437,413, filed on Dec. 21, 2016.

(51) Int. Cl.
*G01R 33/10* (2006.01)
*G01C 21/20* (2006.01)
(Continued)

(52) U.S. Cl.
CPC ............. *G01C 21/206* (2013.01); *G01D 5/12* (2013.01); *G01R 33/10* (2013.01); *G01S 1/7034* (2019.08);
(Continued)

(58) Field of Classification Search
CPC ......... G01B 7/004; G01S 1/7034; G01S 5/16; G01S 1/70; G01S 1/7038; G01S 5/02;
(Continued)

(56) References Cited

U.S. PATENT DOCUMENTS 4,054,881 A   10/1977 Raab
6,549,004 B1   4/2003 Prigge
(Continued)

FOREIGN PATENT DOCUMENTS

CA      2934736 A1    9/2006
CA      2975094 A1    2/2018
WO   20150161360 A1   10/2015

OTHER PUBLICATIONS

WIPO, International Search Report and Written Opinion for International Application No. PCT/CA2017/051554 dated Mar. 21, 2018.
(Continued)

*Primary Examiner* — Lee E Rodak
*Assistant Examiner* — Brent J Andrews
(74) *Attorney, Agent, or Firm* — Norton Rose Fulbright Canada LLP

(57) ABSTRACT

Embodiments described herein relate to a magnetic positioning system and method that allows the position of a receiver to be determined in environments containing conducting material such as concrete. A number of transmitters create modulated magnetic fields which are distorted as they propagate through the conducting materials. A finite difference time domain (FDTD) simulation of the environment is used to generate an accurate model of the fields within the environment. A receiver is used to measure the field strength of each transmitter. The receiver position is determined by evaluating the misfit between the received fields and the values in the FDTD model.

50 Claims, 15 Drawing Sheets

(51) Int. Cl.
  *G01D 5/12* (2006.01)
  *G01S 1/70* (2006.01)
(52) U.S. Cl.
  CPC ......... *G01S 1/7038* (2019.08); *G01S 2201/01* (2019.08)
(58) Field of Classification Search
  CPC .... G01S 5/0252; G01S 13/751; G01S 13/878; G01R 33/10; G01C 21/00; G01C 21/206; G01D 5/12; G06Q 10/087
  See application file for complete search history.

(56) References Cited

U.S. PATENT DOCUMENTS

| | | | |
|---|---|---|---|
| 6,757,557 B1 | 6/2004 | Bladen et al. | |
| 9,002,675 B2 | 4/2015 | McIntyre | |
| 9,351,106 B2 | 5/2016 | Markham | |
| 2006/0192709 A1* | 8/2006 | Schantz | G01V 15/00 342/125 |
| 2013/0226512 A1* | 8/2013 | McIntyre | G01V 3/081 702/151 |
| 2014/0062792 A1 | 3/2014 | Schantz | |
| 2017/0187471 A1* | 6/2017 | Roper | H04B 1/40 |
| 2017/0228569 A1* | 8/2017 | Mardkha | G06K 7/10425 |

OTHER PUBLICATIONS

Cruz, O et al. "3D indoor location and navigation based on Bluetooth", 21st International Conference on Electrical Communications and Computers, 2011, pp. 271-277, Feb. 28-Mar. 2, 2011.
Pasku, V. et al., "Magnetic Field Analysis for Distance Measurement in 3D Positioning Applications", Proceedings of the 12th Instrumentation and technology Conference I2MTC, May 23-26, 2016.
Sheinker, A et al., "Localization in 3D using Beacons of Low Frequency Magnetic Field", IEEE Transactions on Instrumentation and Measurement, vol. 62, No. 12, Dec. 2013.
Ralchenko, M. et al., "Finite-difference time-domain modelling of through-the-earth radio signal propagation", Computers and Geosciences 85 (2015), pp. 184-195.
Ijaz, A. et aL, "Improved SNR Estimation for BPSK and QPSK signals", Electronics Letters, vol. 45, No. 16, pp. 858-859, Jul. 2009.
Bronaugh, E.L., "Helmholtz Coils for Calibration of Probes and Sensors: Limits of Magnetic Field Accuracy and Uniformity", Proceeds of the 1995 IEEE International Symposium on Electromagnetic Compatibility, Aug. 14-18, Atlanta, GA.

* cited by examiner

| | | | | | | | | | | | | | | |
|---|---|---|---|---|---|---|---|---|---|---|---|---|---|---|
| 30 | 30 | 30 | 30 | 30 | 31 | 30 | 30 | 31 | 30 | 30 | 30 | 30 | 30 | 30 |
| 31 | 31 | 31 | 31 | 30 | 30 | 30 | 30 | 30 | 30 | 30 | 30 | 31 | 30 | 31 |
| 31 | 30 | 30 | 30 | 30 | 31 | 30 | 30 | 30 | 30 | 30 | 30 | 30 | 30 | 30 |
| 32 | 30 | 30 | 31 | 30 | 30 | 30 | 30 | 30 | 30 | 30 | 31 | 30 | 32 | 32 |
| 30 | 30 | 30 | 30 | 30 | 29 | 29 | 28 | 22 | 27 | 30 | 30 | 30 | 30 | 30 |
| 28 | 25 | 25 | 26 | 25 | 24 | 23 | 18 | 12 | 18 | 22 | 24 | 26 | 30 | 30 |
| 22 | 22 | 20 | 21 | 20 | 16 | 14 | 6.7 | 3.5 | 7.6 | 11 | 14 | 16 | 24 | 25 |
| 14 | 10 | 9.5 | 6.6 | 4.4 | 2.2 | 1.0 | 0.6 | 0.5 | 0.6 | 0.9 | 1.0 | 4.4 | 7.5 | 15 |
| 10 | 9.8 | 5.5 | 3.0 | 1.1 | 0.9 | 0.6 | 0.3 | 0.2 | 0.3 | 0.6 | 0.9 | 1.1 | 1.6 | 7.0 |
| 16 | 13 | 7.7 | 5.5 | 4.4 | 1.7 | | 0.6 | 0.4 | 0.5 | | 1.5 | 3.0 | 6.0 | 10 |
| 22 | 22 | 19 | 17 | 15 | 14 | 5.6 | 4.5 | 4.2 | 6.6 | 7.0 | 11 | 13 | 15 | 16 |
| 21 | 20 | 20 | 21 | 19 | 15 | 11 | 8.8 | 6.6 | 8.1 | 10 | 13 | 15 | 19 | 20 |
| 30 | 30 | 25 | 28 | 26 | 27 | 20 | 16 | 15 | 16 | 21 | 24 | 27 | 30 | 29 |
| 30 | 31 | 30 | 30 | 30 | 30 | 30 | 30 | 29 | 30 | 30 | 31 | 30 | 30 | 30 |
| 34 | 31 | 30 | 30 | 30 | 30 | 30 | 30 | 30 | 30 | 30 | 30 | 30 | 30 | 30 |

Figure 17

MAGNETIC POSITIONING SYSTEM

CROSS REFERENCE TO RELATED APPLICATIONS

This application is national stage entry of PCT/CA2017/051554 filed Dec. 20, 2017, which claims the benefit of and priority to U.S. provisional application No. 62/437,413 filed Dec. 21, 2016, the contents of all of which are hereby incorporated by reference.

FIELD

Embodiments described herein generally relate to the field of very low frequency (VLF) positioning systems, and more specifically to VLF positioning in an environment constructed with, or otherwise including, conducting materials.

INTRODUCTION

Accurate determination of vehicle location and orientation is useful in the context of autonomous vehicles, for example. In areas with access to areas of open sky, vehicles can receive signals from satellite based global navigation satellite systems (GNSS) to determine their location and direction of travel. Such coverage is available world-wide.

There are types of environments that vehicles have to navigate, such as underground mines, tunnels and parking garages, where the satellite signals cannot penetrate. This may be due to the shielding effect of the overlying concrete and overburden, which is weakly conducting. In such environments, local positioning systems can use pseudo-satellites (pseudolites), which transmit signals simulating the GNSS waveforms. However, the transmission of simulated GNSS signals may not be practical in many cases as any signal leakage outside the obstructed area causes interference with the actual external GNSS signals. An alternate method of navigating in a GPS denied environment is to use an inertial navigation system (INS). These are electromechanical systems in which errors accumulate, making the cost of accurate INS sensor high for use in passenger vehicles.

There is a need for an accurate positioning system that can be used by autonomous vehicles to navigate in GPS denied environments, and in particular within environments that include conducting materials, such as parking garages, tunnels and mines.

SUMMARY

In accordance with an aspect, there is provided a magnetic positioning system and method that allows the position of a receiver to be determined in environments including conducting material such as concrete. A number of transmitters create modulated magnetic fields which are distorted as they propagate through the conducting materials. A finite difference time domain (FDTD) simulation of the environment is used to generate an accurate model of the fields within the environment. A receiver is used to measure the field strength of each transmitter. The receiver position is determined by evaluating the misfit between the received fields and the values in the FDTD model.

Embodiments described herein may provide a system and a method that provide the location of a receiver within an environment containing conducting materials by means of a very low frequency magnetic field capable of penetrating such materials. Embodiments described herein may describe a method by which the location of the receiver is determined with reference to a model of the magnetic fields inside the environment derived from a FDTD simulation of the environment and the transmitters used to generate a low frequency magnetic field.

In accordance with an aspect there is provided a digital magnetic induction positioning system comprising a number of spatially separate transmitters and antennas, a three-axis receive antenna connected to a three-channel receiver that determines the magnitude of the magnetic field from each transmitter, and a signal processor connected to the receiver, said processor being configured to estimate the location of the receive antenna by comparing the amplitude of the magnetic field from the ensemble of transmitters with the ensemble of magnetic field amplitudes in each cell of a model of the environment, created through an FDTD simulation of said transmitters and the electrical properties of the materials in the physical environment, in order to determine which cell has the minimum misfit, or aggregated error, between the measured data and the model cell data, and then converting the location of said cell in the FDTD derived model into the corresponding physical map position within the environment.

In accordance with another aspect, there is provided a method of providing an estimate of the position of a VLF receiver within an environment, the method comprising; creating a model of the magnetic fields created by a number of spatially separated transmitters located in an environment through an FDTD simulation in which said environment is mapped as a volume of uniform cells, each having electrical properties derived from the materials in the environment; using a 3D antenna and 3 channel receiver to measure the amplitude of the magnetic field of each transmitter and comparing the amplitude of the magnetic field from the ensemble of transmitters with the ensemble of magnetic field amplitudes in each cell of the FDTD derived model of the environment, in order to determine which cell has the minimum misfit, or aggregated error, between the measured data and the model cell data, and then converting the location of said cell in the FDTD derived model into the corresponding physical map position within the environment.

In an aspect, embodiments described herein may use a test receiver to measure the magnetic field at a number of known locations in the environment and fit a conductivity model using FDTD simulation by aligning the observed and calculated magnetic field strengths, using a data inversion process which is uniquely adapted to the physical properties of manmade structures.

In an aspect, the receiver location may be determined by fitting an ellipse around the cells in the FDTD derived model which have a misfit below a chosen tolerance. The center of this ellipse will give the receiver position, which is normally also located within the cell with the least misfit. The orientation of the ellipse, and the magnitude of the semi-major and semi-minor axes, give a measure of uncertainty for the receiver position.

In an aspect, embodiments described herein may use transmitters that are time multiplexed within a common transmitter frame. Other embodiments described herein may use transmitters that are frequency multiplexed.

In an aspect, embodiments described herein may use a single transmitter to drive a number of different antennas. Other embodiments described herein may use a separate transmitter for each transmit antenna. Many further features and combinations thereof concerning embodiments described herein will appear to those skilled in the art following a reading of the instant disclosure.

In accordance with embodiments, there is disclosed a magnetic positioning system. The magnetic positioning system comprises a VLF receiver and a processor communicatively coupled to the VLF receiver. The VLF receiver is configured to detect a magnetic field transmitted from a VLF magnetic field transmitter, and estimate a total magnetic field strength from the VLF magnetic field transmitter. The processor is configured to obtain a three-dimensional model of the magnetic field transmitted by the VLF transmitter, and determine a location of the VLF receiver based on the three-dimensional model.

In accordance with embodiments, there is disclosed a method of generating a three-dimensional (3-D) model of an environment including conductive material. The method comprises detecting magnetic fields transmitted from at least one VLF magnetic field transmitter, estimating a total magnetic field strength from the at least one VLF magnetic field transmitter, and generating a 3-D model of magnetic fields transmitted by the at least one VLF transmitter.

In accordance with embodiments, there is disclosed a method of determining a locating of an object in an environment including conductive material. The method comprises obtaining a three-dimensional model of the environment at a VLF receiver coupled to the object, and determining a location of the VLF receiver based on the 3-D model.

In accordance with embodiments, there is disclosed a magnetic field emitting system. The magnetic positioning system comprises at least one VLF magnetic field transmit antenna, and a VLF transmitter communicatively coupled to the at least one VLF magnetic field transmit antenna. The transmitter output current flowing through the at least one VLF magnetic field antenna emits a low frequency magnetic field from each VLF magnetic field antenna location.

In accordance with embodiments, there is disclosed a method of emitting a magnetic field. The method comprises modulating a signal to be sent to a VLF magnetic field transmit antenna from a VLF magnetic field transmitter, and transmitting the modulated signal from a VLF magnetic field transmitter to a VLF magnetic field transmit antenna.

In accordance with embodiments, there is provided a non-transitory computer-readable storage medium comprising computer-executable instructions for causing a processor to create a physical model of the environment based on a uniform cell size with a conductance value assigned to each cell to model the electrical properties of the structure; set up a VLF transmitter in the environment, and obtain a number, N, of measurements of the received field strength from the transmitter at known locations, the measurements including observed field strengths; assign a number, M, of initial conductivity values to the major features of the structure, wherein M<N; perform an FDTD simulation to create a model of the magnetic fields within the structure, the model including simulated field strengths; and optimize the conductivity values to minimize a misfit between simulated field strengths and the observed field strengths.

BRIEF DESCRIPTION OF THE DRAWINGS

Embodiments will now be described, by way of example only, with reference to the attached figures, wherein in the figures:

FIG. 17 illustrates, in a diagram, an example of the operation of the positioning algorithm.

It is noted that throughout the figures, like features are identified by like reference numerals.

DETAILED DESCRIPTION

Figure 1:
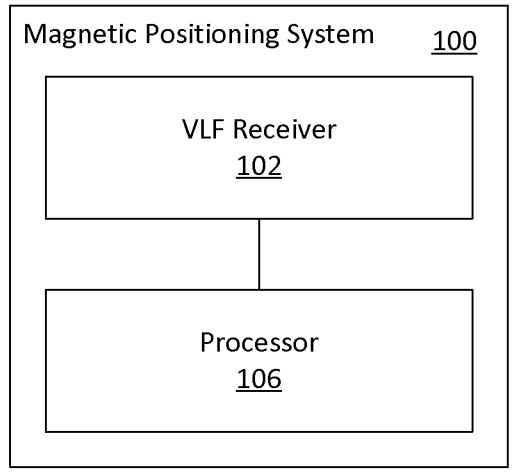
FIG. 1 illustrates, in a block diagram, an example of a magnetic positioning system, in accordance with embodiments of the present disclosure.

Embodiments described herein may provide a magnetic positioning system for environments that constructed using, or otherwise include, conducting material (e.g., magnesium phosphosilicate cement MPSCM, or steel reinforced concrete). Such environments include underground mines, tunnels and parking structures.

Systems based on using radio frequency (RF) waveforms, such as Wi-Fi, or Bluetooth, have been proposed. In such systems, a receiver determines its location based on the signal level or direction of arrival of the signals from a number of transmitters set up at known fixed locations. However, RF based methods are degraded by the presence of multipath signals created by the signal from the local transmitter undergoing multiple reflections from the ground and other conducting structures in the environment. Reinforced concrete, which is widely used in the construction of parking garages and underpasses, has a relatively high conductivity property, and thus acts as a good reflector of RF signals. As the vehicle moves through such an environment, the multipath signals create rapid changes in the amplitude and phase of the received signal creating errors in the estimated distance or direction of arrival from each transmitter, and hence in the overall position estimate.

The multipath problem can be mitigated by using a very low frequency (VLF) signal which is able to penetrate conductive materials without being reflected. Several systems have been proposed with frequencies in the 0.5 to 20 kHz range. At these frequencies, the antennas used for transmission are smaller than the RF wavelength. Thus, the system is constrained to operate in the near field reactive zone of the antenna, where the magnetic field component dominates. A VLF magnetic field can be both transmitted and received using simple loop antennas. In order to relate the magnetic field configuration produced by the transmitters to the position of the receiver, the magnetic field source positions and orientations must be known. The receiver must be able to perform magnetic field measurements and invert the measurement models to determine its location.

Systems described in the art generally assume that the magnetic field propagates through the environment as if it were in free space. One such system includes positioning systems using low frequency magnetic fields that assume free-space field equations, and have a relatively high error when used inside a man-made structure. Another such system includes localization means in two dimensions (2D) and three dimensions (3D) using beacons generating low frequency magnetic fields and employing probabilistic solutions to determine position. Field strengths are based on the free space propagation equations, which introduce errors due to ground conductivity. Yet another such system uses a near field phase measurement method that can be used to determine the distance from a transmitter within a range 0.1 to 0.5 wavelengths. The distance measurement method also assumes free space propagation, but operates at in the 200 kHz to 40 MHz frequency range where conducting materials cause significant attenuation or reflection of the signals. Yet another such system includes a VLF positioning system in which the transmitter signals are encoded by means of spatially changing magnetic field. The system uses a reference receiver and feedback means to adapt the transmitter characteristics in response to a change in the environment, but the distance estimates are based on free space propagation conditions.

In many environments, man-made or geological structures may be conducting to the extent that even very low frequency magnetic fields are distorted as they pass through them. For example, the reinforced concrete floors used to build many large structures, such as parking garages and tunnels, can attenuate components of a 4 kHz VLF magnetic field. The same behavior is exhibited by the beds of coal surrounding the excavated areas of a coal mine. This attenuation changes the amplitude of the magnetic field at the receiver located inside such a structure, and when the measured amplitude data is inverted, the calculated distance from the transmitter is in error. However, the closed form path loss formulas cannot be used to calculate the field strength due to any structure more complicated than a simple half-space. This in turn makes it difficult to accurately estimate a position inside such an environment, either through inversion of the measured field strength or measurement of the direction of arrival of the magnetic fields. Such environments can be surveyed in order to determine the field strength throughout the environment, but this is a time-consuming and expensive process that has to be repeated each time a transmitter location is changed. For example, a discretized model of the low frequency magnetic field may be used to measure position. However, the field must be entirely measured a-priori, using a robotic mapping device. A very short-range positioning system for use on the human body may be used. Free space propagation is also assumed, and the field distortion is compensated by a second body worn reference receiver.

Embodiments described herein relate to a magnetic positioning system used to determine the location of a vehicle in a global positioning system (GPS) denied environment that includes conducting materials, for example a parking garage or tunnel constructed from concrete.

FIG. 1 illustrates, in a block diagram, an example of a magnetic positioning system 100, in accordance with embodiments of the present disclosure. The magnetic positioning system 100 comprises a very low frequency (VLF) receiver 102 and a processor 106. The VLF receiver 102 is configured to detect transmitted magnetic fields and estimate the total magnetic field strength from each transmitter. The processor 106 is configured to obtain a three-dimensional model of magnetic fields generated by at least one VLF magnetic transmitter, and to determine the location of the object. In some embodiments, the three-dimensional model may be obtained by the VLF receiver 102 receiving the model prior to entering an environment having conductive material (such as an underground mine, tunnel or parking garage). In some embodiments, the VLF receiver 102 may be configured to generate the three-dimensional model for future use by the VLF receiver 102 or other VLF receivers 102. The VLF receiver 102 and the processor 106 will be described in further detail below.

Figure 2A:
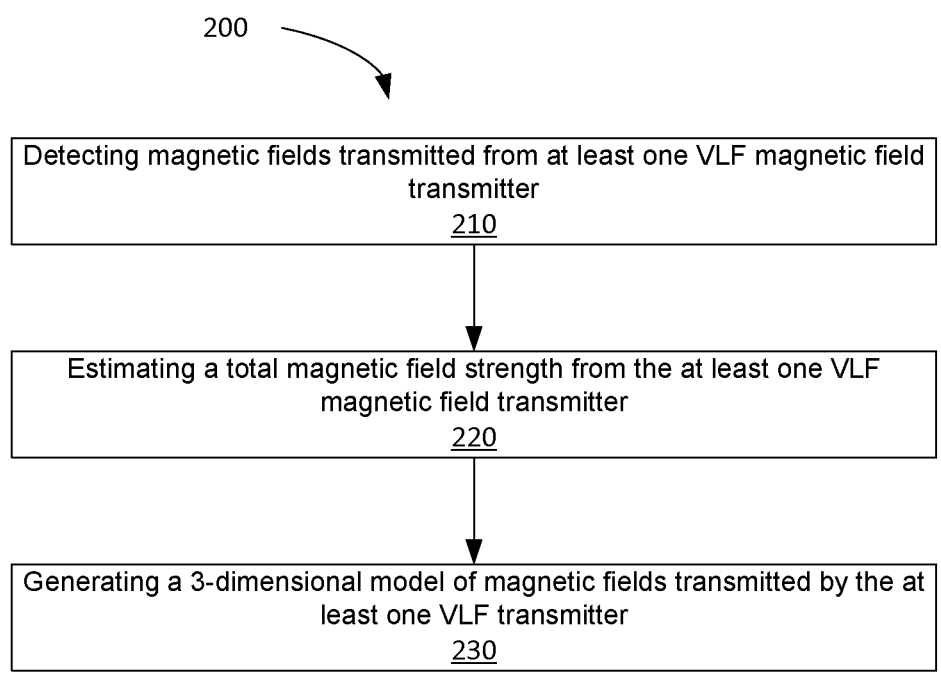
FIG. 2A illustrates, in a flowchart, an example of a method of generating a three-dimensional model of an environment including conductive material, in accordance with the magnetic positioning system.

FIG. 2A illustrates, in a flowchart, an example of a method 200 of generating a three-dimensional model of an environment including conductive material, in accordance with the magnetic positioning system. The method 200 comprises detecting 210, at a VLF 102 receiver, magnetic fields transmitted from at least one VLF magnetic field transmitter. In some embodiments, a series of test measurements may be obtained by the VLF 102. Next, the VLF receiver 102 estimates 220 a total magnetic field strength from the at least one VLF magnetic field transmitter. In some embodiments, the test measurements may be used in an FDTD-based optimization scheme to build a conductivity model. Next, the processor 106, that is communicatively coupled to the VLF receiver 102, uses the conductivity model to generate 230 a 3-dimensional model of magnetic fields transmitted by the at least one VLF transmitter. Thus, a 3-dimensional model of magnetic fields transmitted by the at least one VLF transmitter has been generated and can be used in the future by the VLF receiver 102, or other VLF receivers 102, to determine its location within the generated 3-dimensional model. Steps performed in the method 200 will be described in further detail below.

Figure 2B:
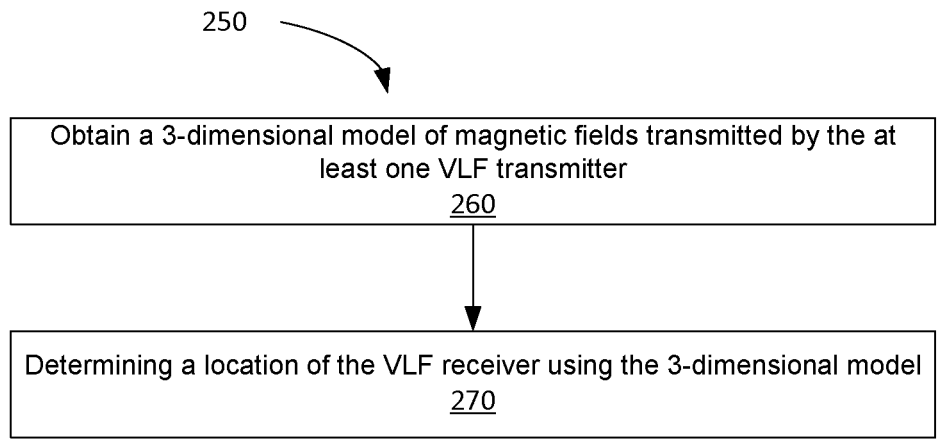
FIG. 2B illustrates, in a flowchart, an example of a method of determining a position of an object in an environment including conductive material, in accordance with the magnetic positioning system.

FIG. 2B illustrates, in a flowchart, an example of a method 250 of determining a position of an object in an environment including conductive material, in accordance with the magnetic positioning system. The method 250 comprises obtaining 260 a three-dimensional (3-D) model of an environment including conductive material. For example, an object such as a vehicle may, receiver or obtain the 3-D model prior to entering an underground parking garage, tunnel or mine. Next, a processor 106 may determine 270 a location of a VLF receiver 102, that is coupled to the object (e.g., vehicle), by using the 3-D model. This location is the location of the object since the VLF receiver 102 is co-located with the object. Steps performed in the method 250 will be described in further detail below.

Figure 3:
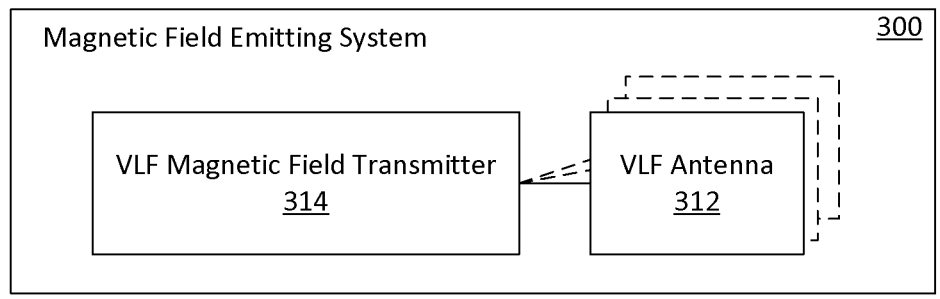
FIG. 3 illustrates, in a block diagram, an example of a magnetic field emitting system, in accordance with embodiments of the present disclosure.

FIG. 3 illustrates, in a block diagram, an example of a magnetic field emitting system 300, in accordance with embodiments of the present disclosure. The magnetic field emitting system 300 comprises a VLF magnetic field transmitter 314 and at least one VLF antenna 314 (i.e., a VLF transmit (Tx) antenna). The VLF transmitter 314 is communicatively coupled to the at least one VLF antenna 312. VLF transmitter 314 output current flowing through the at least one VLF magnetic field antenna emits a low frequency magnetic field from each VLF magnetic field antenna 312 location. The VLF transmitter 314 may be configured to modulate the transmitter output current flowing through each VLF magnetic field antenna 312. The VLF transmitter 314 and antenna 312 will be further described below.

Figure 4:
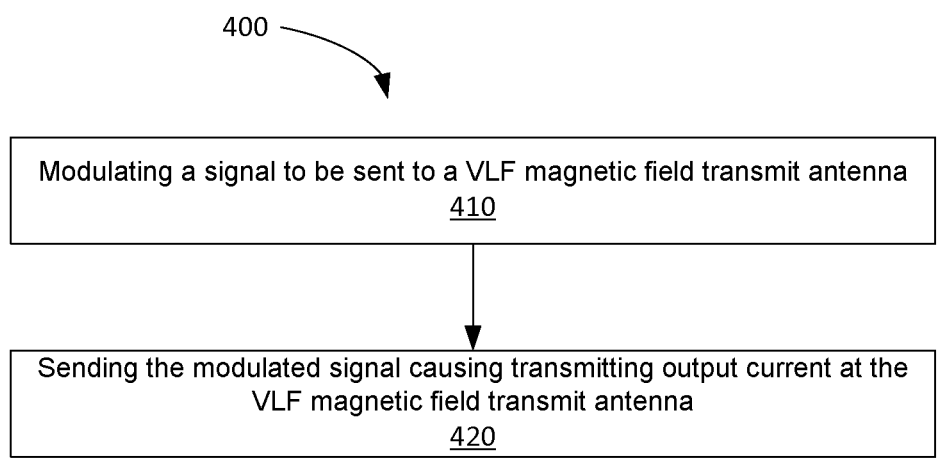
FIG. 4 illustrates, in a flowchart, an example of a method of emitting a magnetic field, in accordance with the magnetic field emitting system.

FIG. 4 illustrates, in a flowchart, an example of a method 400 of emitting a magnetic field, in accordance with the magnetic field emitting system. The method 400 comprises modulating, from a VLF magnetic field transmitter, a signal to be sent to a VLF magnetic field transmit antenna. Next the VLF magnetic field transmitter 314 transmits to the a VLF magnetic field transmit antenna 312 the modulated signal. The transmitter output current causes a first magnetic field to be emitted from the VLF magnetic field transmit antenna 312. The first magnetic field may be modulated to be different from another magnetic field emitted from another VLF magnetic field transmit antenna 312. The emission of magnetic fields will be further described below.

Figure 5:
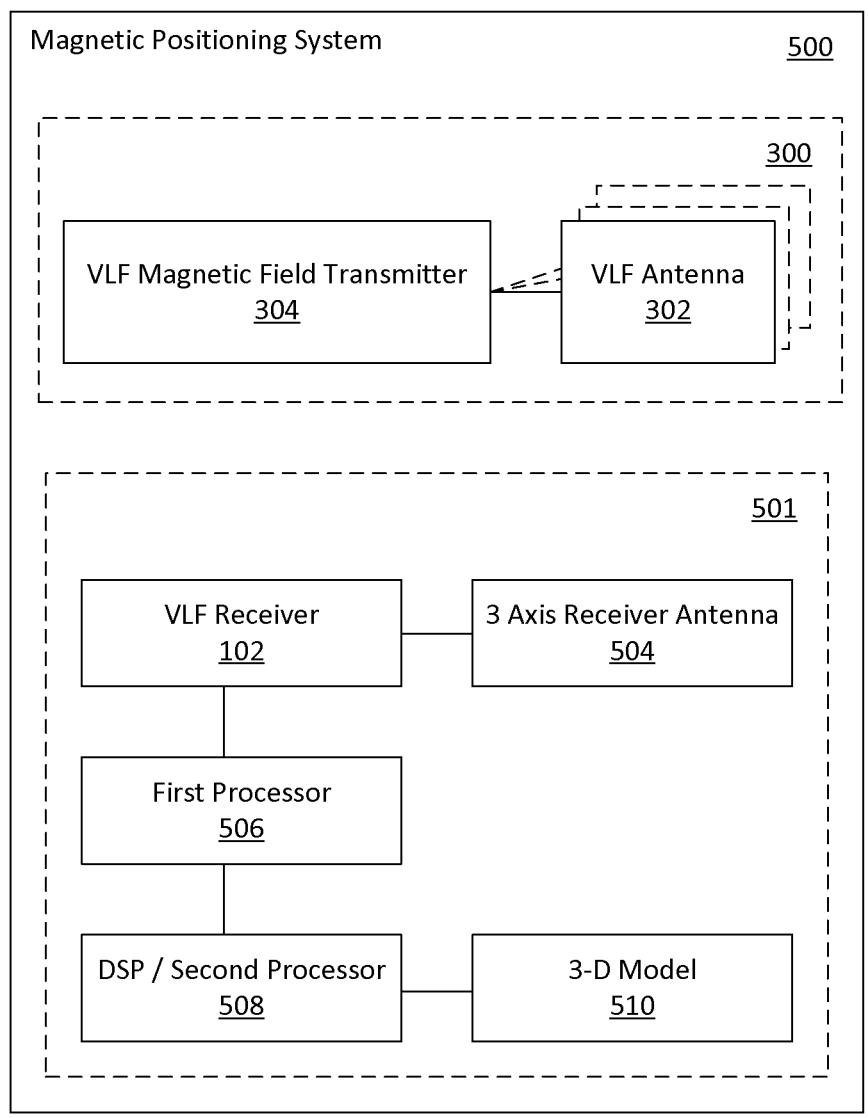
FIG. 5 illustrates, in a block diagram, another example of a magnetic positioning system, in accordance with embodiments of the present disclosure.

FIG. 5 illustrates, in a block diagram, another example of a magnetic positioning system 500, in accordance with embodiments of the present disclosure. The magnetic positioning system 500 comprises the magnetic field emitting system 300, the VLF receiver 102, a three-axis receiver antenna 504 connected to the VLF receiver 102, a first processor 506, a second (digital signaling) processor 508, and a three dimensional (3-D) model 510. It is noted that in some embodiments either or both of the processors 506,508 may be a digital signaling processor (DSP). To generate the 3-D model 510, the second processor 508 may be configured to perform a finite difference time domain (FDTD) simulation of electrical properties of the environment and the VLF transmitter 314 to generate a database of magnetic fields for each cell in the 3-D model 510. It is noted that in some embodiments, the first processor 506 and the second processor 508 may be the same processor 106 (including a DSP). To determine the location of the VLF receiver 102, the processor 106, 506, 508 may be configured to compare measured magnetic field strengths to the field strengths in the database, determine which cell in the FDTD simulation has a least misfit to the measured data, and relate the FDTD model cell location to a physical map location in an environment including conducting material. The magnetic positioning system 500 and its components will be further described below.

Figure 6A:
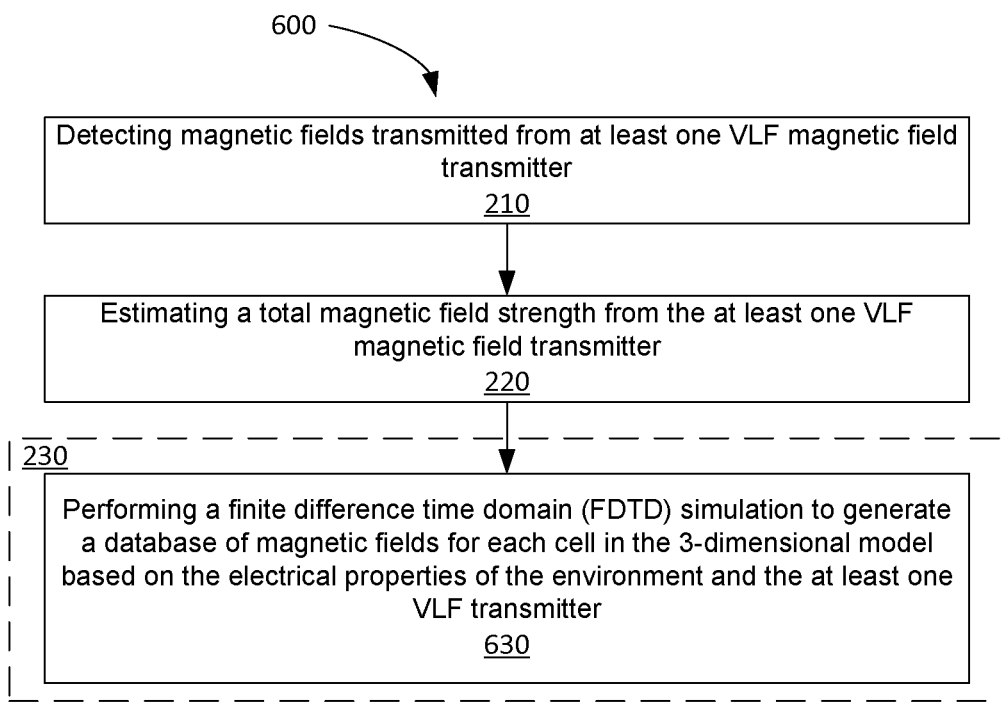
FIG. 6A illustrates, in a flowchart, another example of a method of generating a three-dimensional model of an environment including conductive material, in accordance with embodiments of the magnetic positioning system.

FIG. 6A illustrates, in a flowchart, another example of a method 600 of generating a three-dimensional model of an environment including conductive material, in accordance with embodiments of the magnetic positioning system. The method 600 comprises the steps of the method 200. The step of generating 230 the 3-D model 510 comprises the processor 106, 506 performing 630 a finite difference time domain (FDTD) simulation to generate a database of magnetic fields for each cell in the 3-D model 510 based on the electrical properties of the environment and the at least one VLF transmitter. Steps performed in the method 600 will be described in further detail below.

Figure 6B:
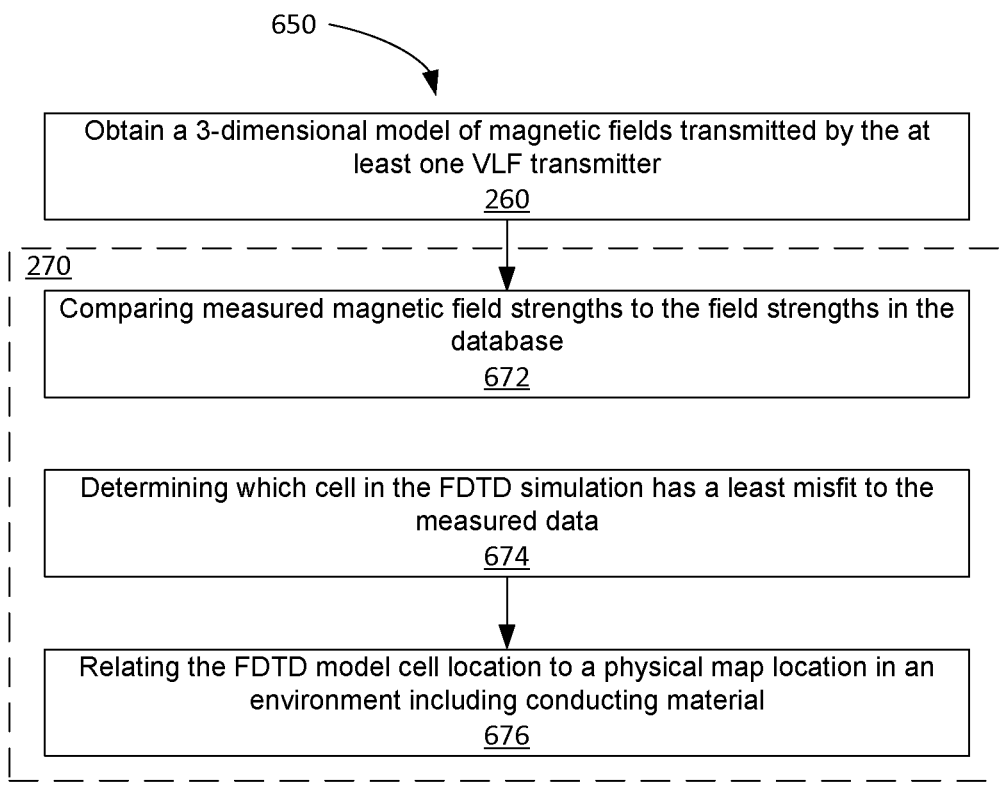
FIG. 6B illustrates, in a flowchart, another example of a method of determining a position of an object in an environment including conductive material, in accordance with embodiments of the magnetic positioning system.

FIG. 6B illustrates, in a flowchart, another example of a method 650 of determining a position of an object in an environment including conductive material, in accordance with embodiments of the magnetic positioning system. The method 650 comprises the steps of the method 250. The step of determining 270 the location of the object (to which a VLF receiver 102 is co-located) comprises the processor 106, 506, 508 comparing 672 measured magnetic field strengths to the field strengths in the database. Next, the processor 106, 506, 508 determines 674 which cell in the FDTD simulation has a least misfit to the measured data. Next, the FDTD model cell location is related 676 to a physical map location in an environment including conducting material. Steps performed in the method 650 will be described in further detail below.

Figure 7:
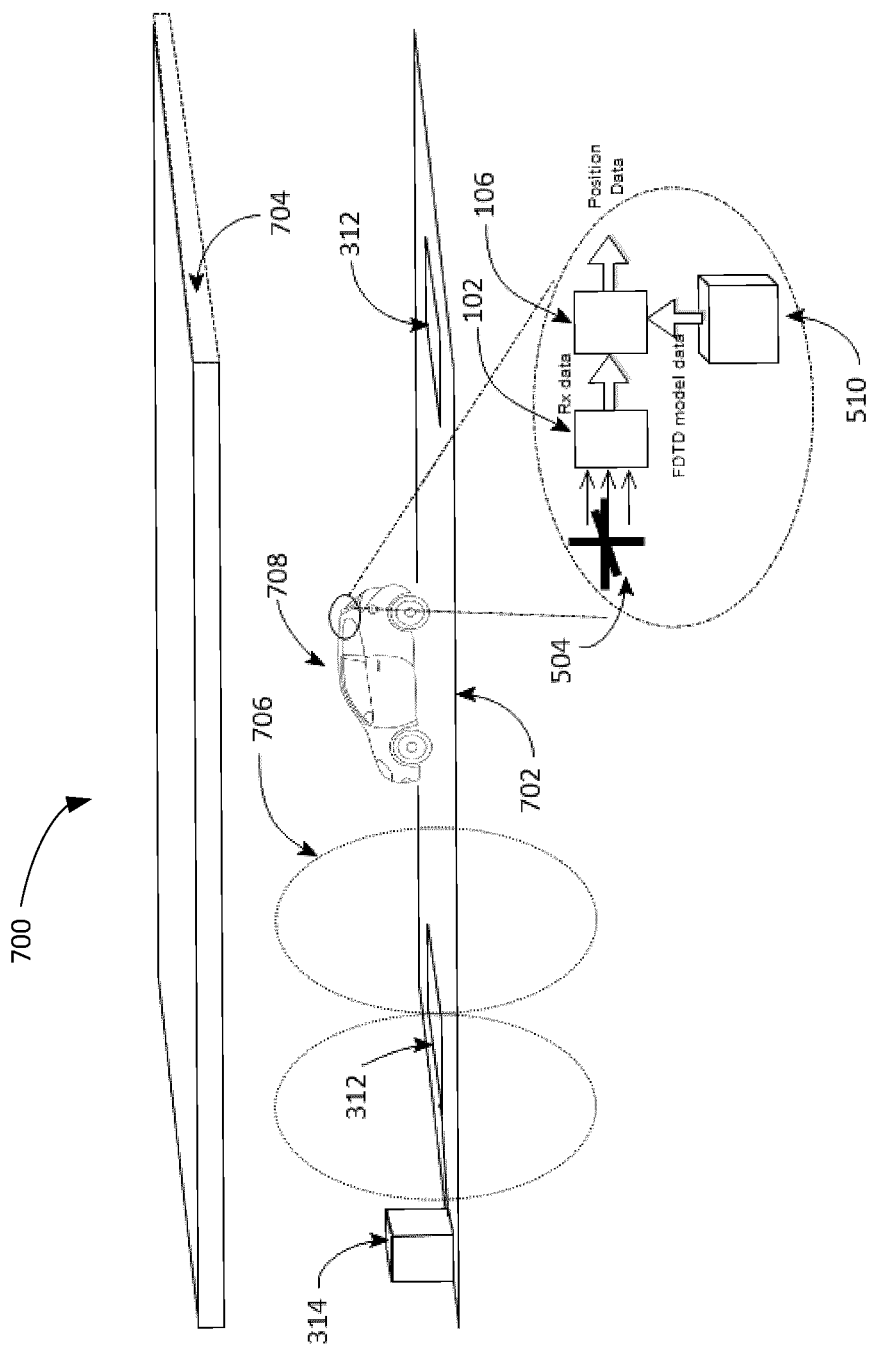
FIG. 7 illustrates, in a system diagram, an example of the Magnetic Positioning System (MPS) according to some embodiments.

FIG. 7 illustrates an exemplary system level diagram 700 of a magnetic positioning system used to determine the location of a vehicle in a GPS denied environment that includes conducting materials in which the environment is represented by an area of the earth 702 which is covered by a roof 704 of conducting material, such as reinforced concrete. In some embodiments, the magnetic positioning system 500 comprises at least one low frequency magnetic field transmit antenna 312, a transmitter 314, a three-axis (3-axis) receive antenna 504, a low frequency receiver 102, a signal processor 106 and a digital model 510 created (i.e., generated) by a finite difference time domain (FDTD) simulation of the transmit antennas and environment, which includes the earth 702 and other nearby conducting materials such as the roof 704.

In order to determine a position in a single dimension (i.e., along a straight path) one transmit (Tx) antenna 312 may be used. In order to determine a position at any location within two dimensions, at least three Tx antennas 312 may be used. In three dimensions, four or more Tx antennas 312 may be used. In some embodiments, a separate transmitter 314 may be used to separately drive each Tx antenna 312. In other embodiments, a single transmitter 314 may be used to generate the drive signals for all the Tx antennas 312. In some embodiments, the transmitter output current flowing through Tx antenna 312 creates (i.e., generates) a low frequency magnetic field 706 which propagates through the conductive environment without being reflected. The magnetic field may also be modulated by transmitter 314 in order to identify the location and transmitter ID to the signal processor 106.

The presence of conductive material in the environment affects the magnitude of the field components. I.e., the penetrating magnetic field induces eddy currents in a conducting material which create (i.e., generate) a secondary, opposing, magnetic field. The degree of attenuation this produces depends on the size and conductivity of the material, and its position and orientation with respect to the transmitted magnetic field 706.

The field 706 transmitted by each Tx antenna 312 is received by the three-axis antenna 504 connected to receiver 102. The transmitted signals are multiplexed either in time or by frequency so that the receiver 102 can process each transmission separately. The model of the environment 510 includes a three-dimensional model, derived through a finite difference time domain (FDTD) simulation, of the magnetic fields as distorted by the conducting materials in the environment, and the physical layout or map of the environment. The receiver 102 continuously measures the total magnetic field strength from each transmitter (i.e., from each Tx antenna 312), and determines its position by calculating the error between the measured field vector and the vectors for the locations in the FDTD simulation contained in model 510. In some embodiments, the receiver position can be given by the coordinates of the FDTD model cell having the least misfit with the measured data. In other embodiments, the receiver location may be determined from the center of an ellipse which covers the model cells in which the misfit is below a threshold value. These model coordinates are then mapped onto the physical layout of the environment to generate position data in a geographical information standard (GIS) format.

The 3-axis antenna 504, receiver 102 and signal processor 106 may be mounted on an object (such as a vehicle 708) which incorporates a number of other sensors and a navigation processor. Through data fusion, the navigation processor uses the data from the MPS 500 and the other sensors to maneuver the vehicle through the environment. In some embodiments, the FDTD derived model 510 may be permanently stored in a memory device (for example, where the vehicle always navigates within the same environment, such as within a warehouse or a mine). In other embodiments, the FDTD model 510 may be uploaded to the vehicle 708 via a wireless data link each time it enters a new GPS denied environment, such as for example a parking garage.

In free space, the magnetic field created by the antenna may be calculated by integrating the contribution from the current elements around the loop antenna, following from the Biot-Savart law:

$$B = \frac{\mu_0}{4\pi} \int_C \frac{Idl \times \hat{r}}{|r|^2}$$ Equation 1 where r is the full displacement vector from the wire element to the point at which the field is being computed and $\hat{r}$ is the unit vector r, dl is a vector whose magnitude is the length of the differential element of the wire, in the direction of conventional current, and $\mu_0$ is the magnetic constant (the symbols in boldface denote vector quantities). Equation 1 can be solved to give closed form solutions for antennas of a known size, and may therefore be used to invert measured field strength data in order to derive the distance to the transmitter. Closed form equations have also been developed for the $H_x$, $H_y$ and $H_z$ components of a magnetic dipole in free space; these may be combined to calculate the total magnetic field. However, there is no closed form expression or approximation that can be applied to account for the attenuation of magnetic field in an environment containing structures of conducting materials.

The finite-difference time-domain (FDTD) simulation is a fully explicit numerical solution to Maxwell's curl equations. As a time-domain solution, it is capable of modelling arbitrary excitations, such as a digitally modulated waveform, and generating a time series of the electro-magnetic behavior. As a differential equation method, FDTD begins with Maxwell's curl equations which contain parameters that define the electrical properties of the medium:

$$\nabla \times E = -\mu \frac{\partial H}{\partial t}$$ Equation 2 and $$\nabla \times H = \sigma E + \varepsilon \frac{\partial E}{\partial t},$$

where E is the electric field; H is the magnetic field; σ is the conductivity of the medium; μ is the permeability of the medium; and ϵ is the permittivity of the medium. The parameters σ, μ, and ϵ are the fundamental electro-magnetic properties. The conductivity a varies over several orders of magnitude for geologic and man-made construction materials, from 1E-5 to 1E3 S/m. The permeability μ can be assumed constant outside of magnetic materials (e.g., magnetite, pyrrhotite); and the permittivity ϵ is largely irrelevant at the very low frequencies used to penetrate solid materials.

The curl equations are discretized and rearranged to form re-cursive update equations, with constants based on the material properties σ, μ, and ϵ, a time step Δt, and a grid with spacing of Δx, Δy, and Δz. The FDTD simulation of the propagating magnetic field is performed by solving these equations for each grid spacing at successive time steps Δt. However, to be stable the time step must not exceed a maximum value, which for a uniform grid is given by:

$$\Delta t \leq \frac{\Delta S}{v_c \sqrt{3}}.$$ Equation 3 where Δs is the size of the grid and $V_c$ is the velocity of light.

At low frequencies (i.e., approximately <10 kHz) and high resolution, the amount of time steps required to perform a simulation can become very large. For example, the maximum time step at 10 cm resolution is 192.6 ps.; the period of a 4000 Hz signal is 0.25 ms. Hence, to model one cycle of this signal, over 1.2 million time-steps are used. In order to perform simulations within a reasonable timeframe, the FDTD model is executed using parallel processing methods. While the simulation is repeated for each transmitter location inside a structure, this is a one-time computational cost.

A second challenge in FDTD is grid termination. When energy propagates through discrete space, it reaches the end of the grid, which presents a discontinuity that causes numeric reflections that impact the results. To reduce this numeric error, energy must be absorbed at the edges (a mechanical analogy is an anechoic chamber). The absorption is achieved using a convolutional perfectly matched layer (CPML) to the boundary of the model 510. These perfectly matched layers are an artificial material added to the grid boundaries. They are reflectionless regardless of the angle of incidence, and so have the effect of making the grid appear infinite to signals propagating through it. Convolution is used to render the method more stable and allows it to handle a wider range of materials.

Figure 8:
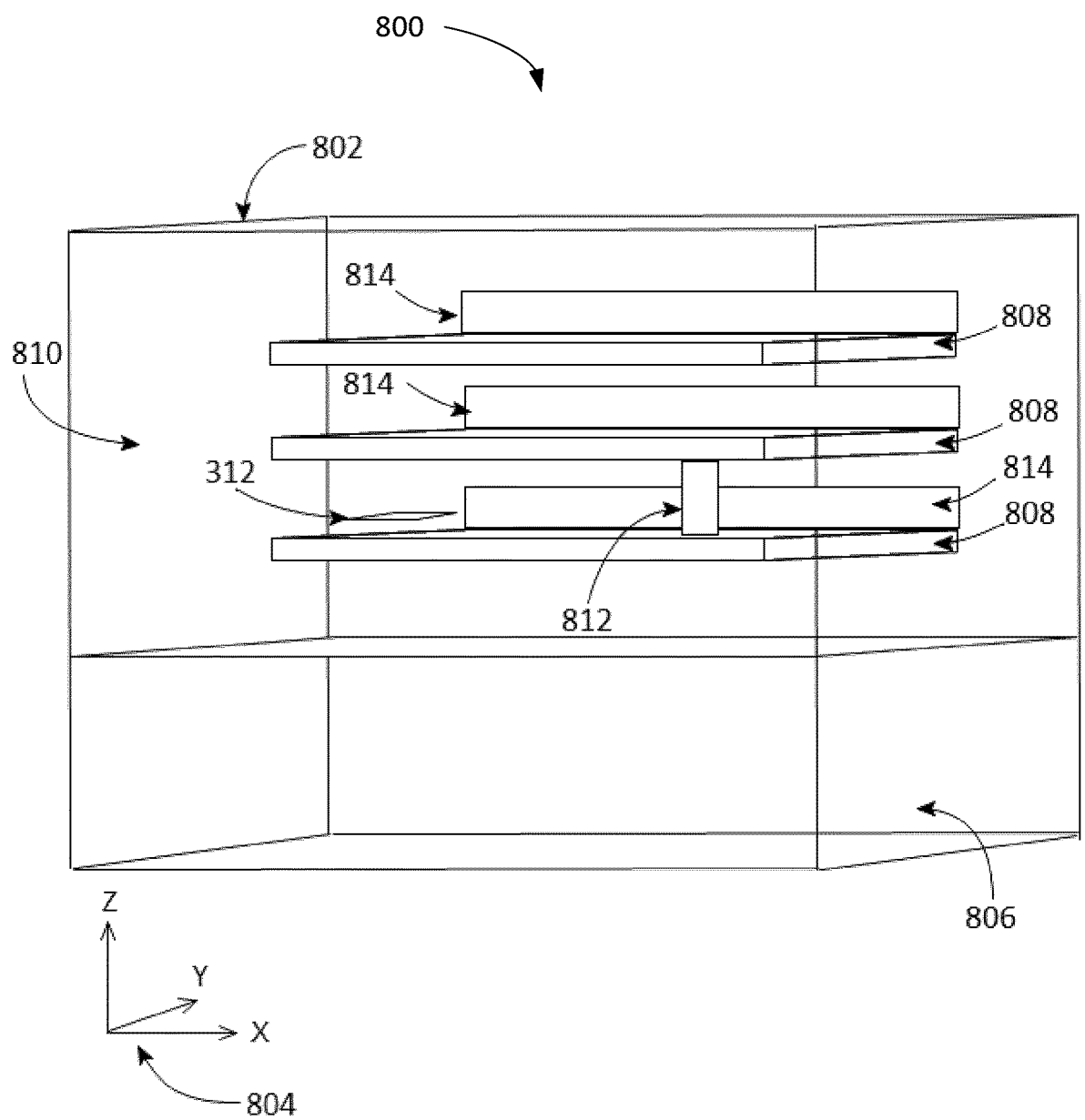
FIG. 8 illustrates, in a graph, an example of the Finite Difference Time Domain model of an environment including conducting materials.

FIG. 8 illustrates an exemplary drawing of a model space 800, using in the Finite Difference Time Domain (FDTD) simulation to model the propagation of the magnetic fields from each of the transmit antenna locations through the environment. This example 800 shows a simulation model including an above ground parking garage. The model 800 is built within a 3-dimensional model volume 802, which is divided by a three-dimensional grid (not shown), based on a Cartesian coordinate system 804, into a number of uniform cells. The earth is modelled as a conductive half-space 806. In the example of FIG. 8, the floors 808 of the parking garage are shown as a set of cells with a characteristic conductivity. Walls and other structures are similarly modelled. For clarity, only the rear walls 814 and one column 812 are shown in the drawing. The rest of the interior 810 and the space surrounding the structure is filled with non-conducting air. A transmit antenna 312 is modelled as a two-dimensional loop of current running along the boundary of one or more grids. The antenna 504 shown in FIG. 7 may have a vertical dipole axis, as these may be conveniently mounted either to the ceilings or buried in the floors of the structure. However, horizontal dipoles may also be used, mounted on posts or to the interior walls of the structure, for example.

The conductivity of the earth half space 806 is also included in the model. In urban areas subject to rainfall, an upper value for the conductivity of the surface geology is 0.1 S/m. Similarly, if the transmit antenna 312 does not have dimensions that exactly match the grid spacing, the current may be adjusted in order to obtain the same dipole moment in the model as the real transmitter.

In the FDTD simulation, the magnetic field is calculated based on the physical configuration of the location, specifically the geometrical layout and the electromagnetic properties of the transmission medium. The unknown parameter of interest is the conductivity ($\sigma$) distribution of the transmission medium. Given an operator A that represents Maxwell's equations, the forward calculation takes a model m of the location and generates a set of calculated magnetic fields $\hat{d}$:

$$\hat{d} = A(m).\qquad\text{Equation 4}$$

The inverse problem seeks to determine a model m that will generate a set of measured magnetic fields $\hat{d}$:

$$m = A^{-1}(d).\qquad\text{Equation 5}$$

The inverse problem can be cast as a optimization problem, where the difference between $\hat{d}$ and d is to be minimized. Expressed as an L2 norm, we conceptually write the problem as minimizing an objective functional $\chi^2$:

$$\min \chi^2 = |d - \hat{d}|^2 \qquad\text{Equation 6}$$

A large number of cells are used to accurately model a large structure, such as a parking garage with the resolution needed to provide an accurate position determination. A global optimization approach, where an exhaustive search is done of all possible models, while conceptually easiest, is computationally infeasible as, in this case, doing each forward calculation takes a lot of a time. Instead, gradient-based search methods are used. Starting from a plausible guess model m, several iterations are run where a sensitivity matrix J is used update the model. The objective functional is updated as:

$$x^2 = \|d - A(m) + J\Delta m\|^2 \qquad\text{Equation 7}$$

and the model update vector $\Delta m$ can be calculated as:

$$\Delta m = (J^T J)^{-1} J^T (d - A(m)) \qquad\text{Equation 8}$$

The sensitivity matrix J, also termed the Jacobian, is calculated as follows:

$$J_{i,j} = \frac{\partial A(m)_i}{\partial m_j} = \begin{pmatrix} \frac{\partial A(m)_1}{\partial m_1} & \cdots & \frac{\partial A(m)_1}{\partial m_M} \\ \vdots & \ddots & \vdots \\ \frac{\partial A(m)_N}{\partial m_L} & \cdots & \frac{\partial A(m)_N}{\partial m_M} \end{pmatrix} \qquad\text{Equation 9}$$

Essentially, each column of the sensitivity matrix describes how each calculated magnetic field changes with a small perturbation to a model parameter. Conceptually, it can be written as:

$$J = \frac{A(m - \delta m) - A(m)}{\delta m} \qquad\text{Equation 10}$$

For a model space with a large number of parameters, M, it is computationally infeasible to use equation 10 to exhaustively calculate the sensitivity matrix. However, for a small M, it is possible. In an environment, such as a parking garage, the conductivity ($\sigma$) of the structural features is due to both the properties of the concrete and the presence of reinforcing material such as rebar or steel mesh. The physical space is already parameterized: a garage has discrete structures such as floors, walls, or pillars. Furthermore, at the typical 4 kHz frequency used by the VLF radios, fine structures (e.g., rebar) cannot be separately imaged, and larger structures can be defined by a single bulk conductivity value. Furthermore, due to the uniform nature of these building components, the conductivity value does not vary significantly within each component or between similar components. Thus, it is therefore possible to model a structure such as a parking garage with a low value of M. Typically a single conductivity value is assigned to the all floors 808. Separate values may be used for large supporting columns 812 and walls 814, which may have different degrees of reinforcement, depending on the extent to which they are load-bearing.

The conductance of each structural feature is the product of the conductivity (in S/m) and material thickness (in m), i.e., $$\text{Conductance } (C) = \text{Conductivity } (\sigma) \times \text{thickness } (d). \qquad\text{Equation 11}$$

In order to model elements of the structure, such as the floors 808 that do not fit exactly into the grid spacing $\Delta s$, the structure dimensions are set to the nearest grid spacing and the model conductivity ($\sigma_m$) is adjusted to give the same conductance value. Thus:

$$\sigma_m = \frac{\sigma \cdot d}{\Delta s} \qquad\text{Equation 12}$$

Similarly, if the transmit antenna 312 does not have dimensions that exactly match the grid spacing, the current may be adjusted in order to obtain the same dipole moment in the model as the real transmitter.

Figure 9:
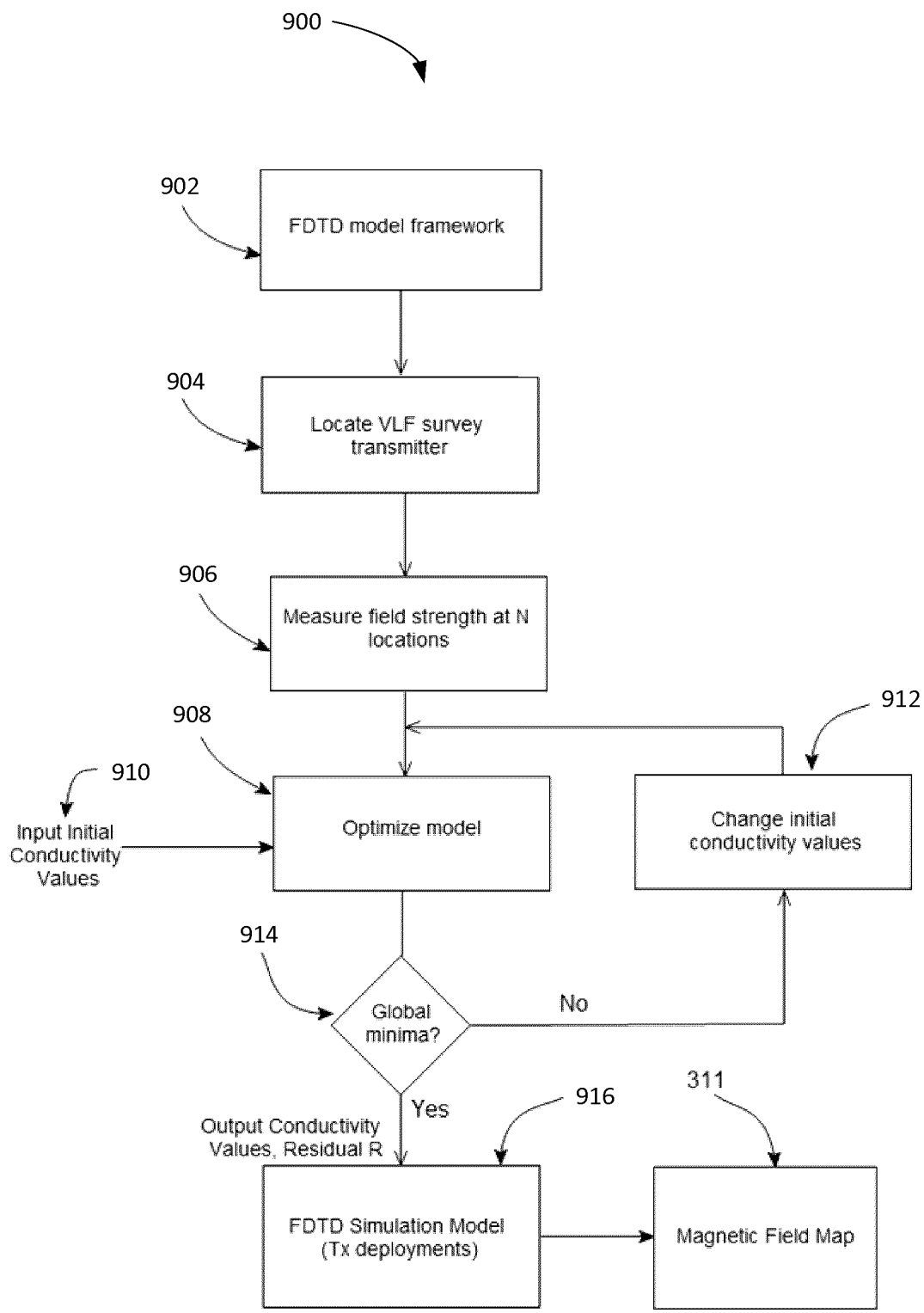
FIG. 9 illustrates in a diagram, an example of the forward modelling process for deriving the conductivity values in the simulation model.

FIG. 9 illustrates, in a flowchart 900, a procedure for determining the conductivity values in the simulation model for a structure such as a parking garage. The procedure 900 starts with the creation of a model framework 902, chosen such that various structures in the garage, such as the floors or the walls, have a uniform conductivity; this approach limits the number of model parameters M. In the next step 904, a VLF transmitter 314 is placed in the parking garage at a location where its signal can be received at all locations in the garage. A moving receiver is used to measure the magnetic field strength at N positions in the parking garage 906.

Equation 9 is only valid provided the inversion problem is not over-parameterized, i.e., M<<N, where N is the number of data points used to determine the M conductivity values. With M=2 or 3, the number of measurement points required is not exhaustive. The measured data is used to optimize Equation 8 from an initial model m in step 908 from an initial set of conductivity values 910. This process is repeated with a different set of initial values for conductivity 912 several times until a global minimum is found 914.

In the optimization 908 of Equation 9, the root mean square (RMS) residual R is used instead of the absolute value, where:

$$R = \sqrt{\frac{x^2}{N}}.$$ Equation 13

This allows for the comparison of models based on a different amount of the data. It also gives a sense of uncertainty in the model (as the difference between the observed magnetic fields and the calculated magnetic fields), which may be used when estimating position uncertainty. Once the conductivity values have been determined at step 914 (i.e., the conductivity values are global minimums), they can be used to construct the FDTD simulation models 916 of the structure using the actual transmitter deployments to be used for position determination. These simulations in turn are used to construct the magnetic field map 918, which together with the RMS residual for the model is used to determine the position of the receiver within the structure.

Figure 10:
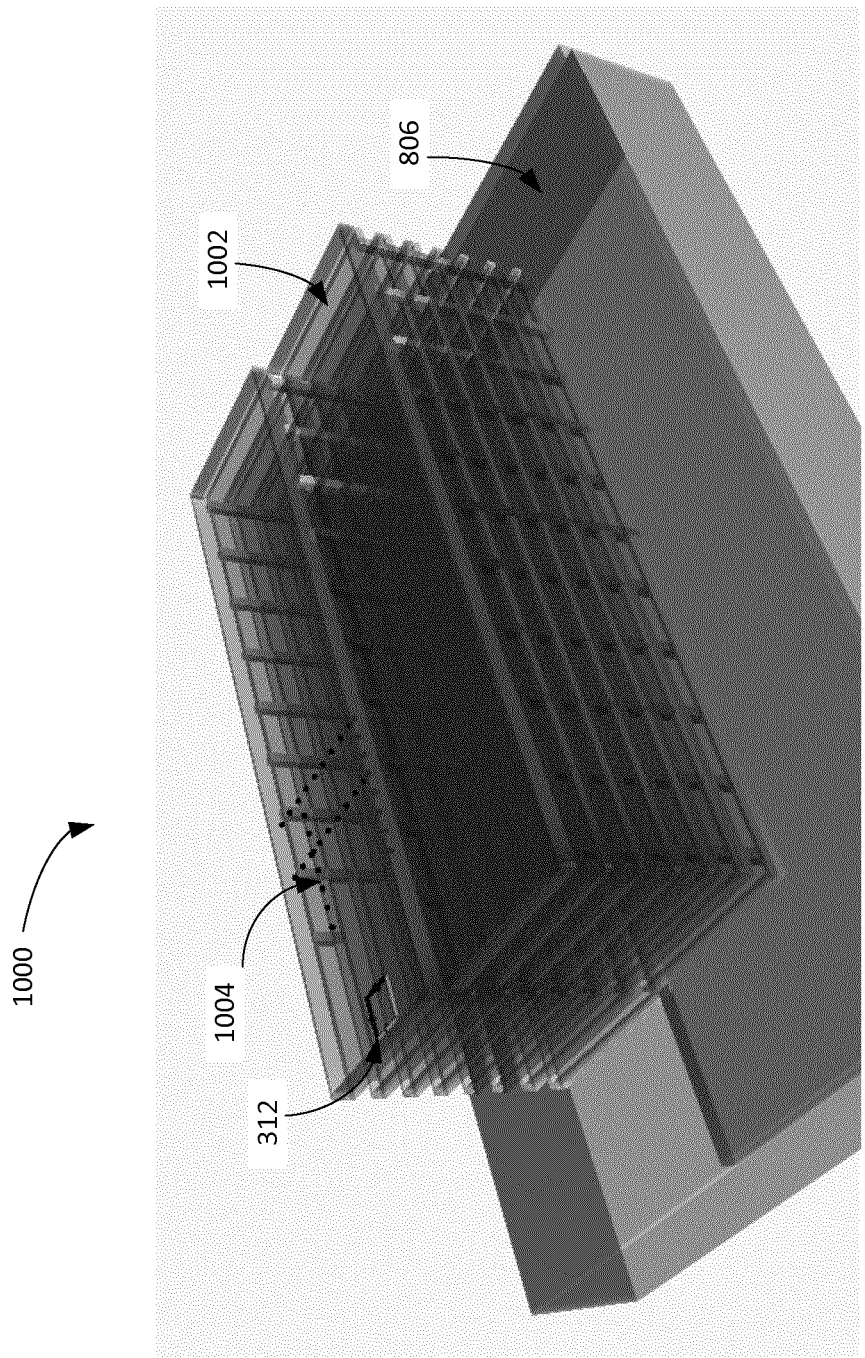
FIG. 10 illustrates an exemplary drawing of the FDTD simulation model for a parking garage.

FIG. 10 illustrates an example of an FDTD simulation 1000 for a parking garage constructed primarily from reinforced concrete. It shows the graphical interface used to construct the physical model of the structure 1002, which in this case has a footprint of 80 m×40 m and a floor height of 4 m. The model space was 100×100×50 m and used a 1 m grid. In the simulation shown, the Tx antenna 312 is located on the upper floor of the structure with its axis vertical and has a dipole moment of 378 Am². The initial starting values for the floor conductance was 50S for the floors, the walls, which have quite large openings, were assigned a much lower conductance of 5 S/m. The FDTD model converged onto quite different values of 7.5 and 55 S/m respectively. The high wall conductivity identified by the model was unexpected and may be due to the presence of a horizontal steel beam.

Figure 11:
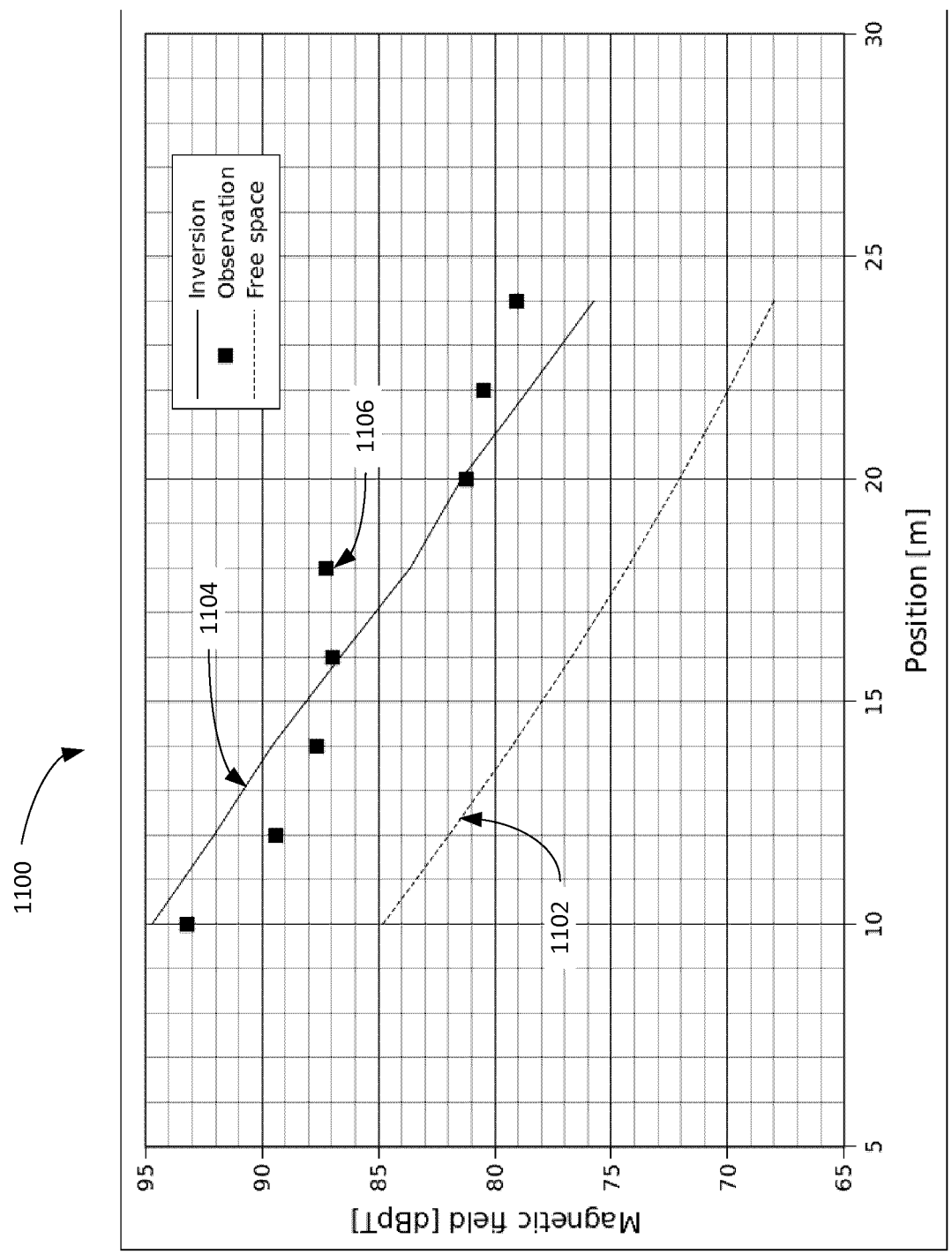
FIG. 11 illustrates a plot comparing the magnetic field strength in a region of the parking garage predicted by the free space field equations and the FDTD simulation.

FIG. 11 illustrates a plot 1100 of total field strength vs. distance at a series of positions 1004 parallel to the parking garage wall. The field strength predicted by free space propagation is shown by the plotted line 1102. The field strength predicted by the FDTD simulation model is shown by the plotted line 1104. The measured data taken at discrete measurement points is shown by the square symbols 1106. This plot shows that the measured field strength agrees fairly well with the FDTD simulation, but these are both almost 10 dB higher than predicted by the free space model 1102. In this case the structure is not attenuating the signal but is found to enhance it, due to the presence of a strong secondary field created by the high conductivity wall. It is clear from this example that using the free space model to invert the measured data would result in large errors in the calculated distance from the transmitter.

Figure 12:
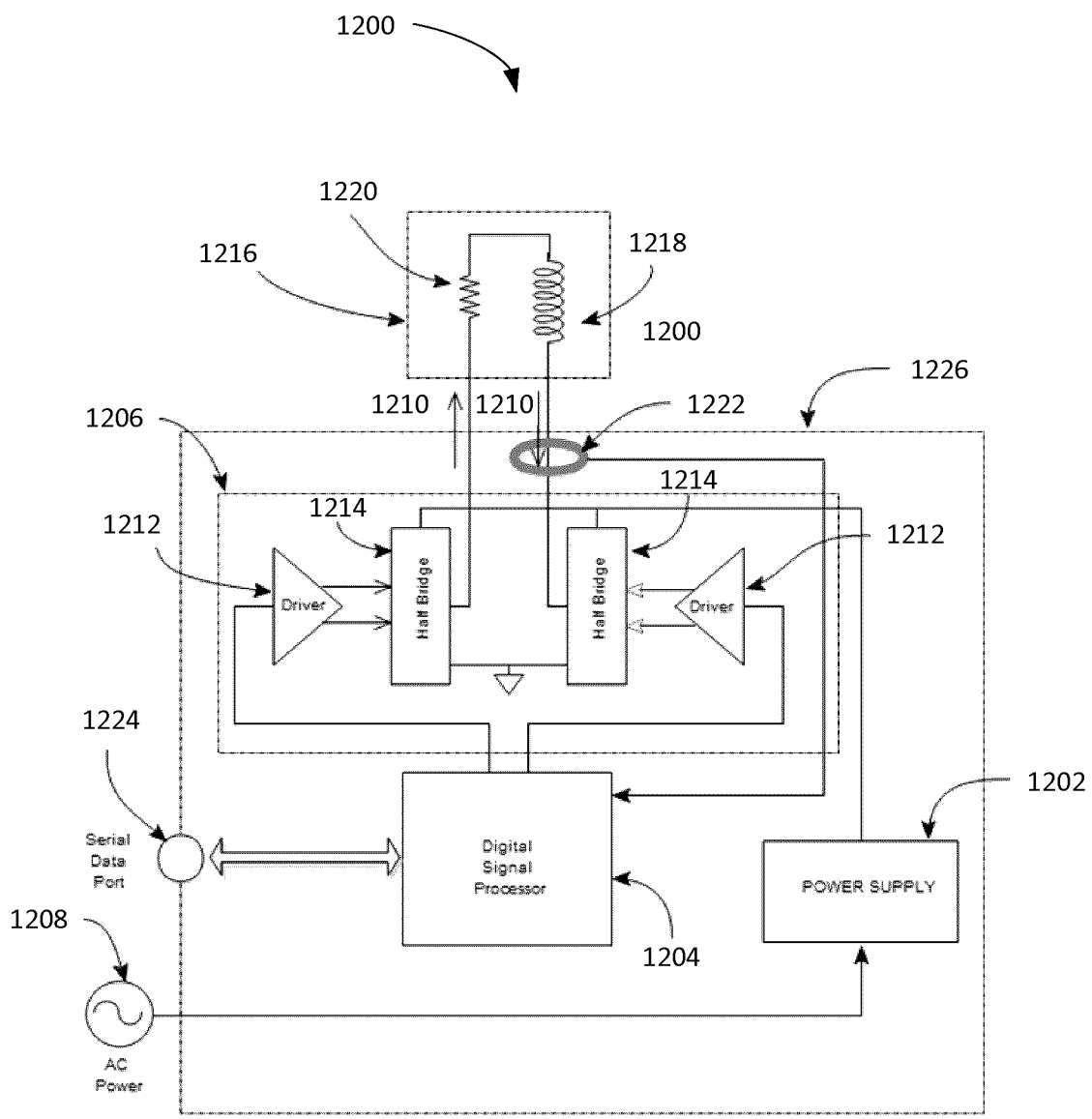
FIG. 12 illustrates, in a block diagram, an example of the MPS transmitter.

FIG. 12 illustrates an exemplary block diagram 1200 of the VLF transmitter 314, which comprises a power supply 1202, a digital signal processor (DSP) 1204 and a pulse width modulator (PWM) 1206. In many environments, an alternating current (AC) source 1208 may be available to provide power to the transmitter; alternatively, a battery source may be used. The power supply 1202 converts the external power to a stable and regulated supply for the PWM 1206 and the DSP 1204. The DSP 1204 generates PWM control signals which synthesize an alternating output current 1210 and, if required, superimpose the modulation upon it. In the PWM modulator 1206, the PWM control signals are fed to drivers 1212, each of which controls the switching of half-bridge 1214. The output from each half bridge is connected to the transmit antenna 1216, which has an impedance represented by series inductor 1218 and resistance 1220.

In some embodiments, the alternating antenna current 1210 may be passed through a current monitor 1222, whose output is fed back to DSP 1204, where the monitor output is sampled. At the DSP 1204, the measured peak output current is compared to the target value, and the transmitter PWM control signal is adjusted to remove any error. By this means of closed loop feedback, the output current of the transmitter 314 is maintained within +/−0.1% of the desired value despite variations in temperature and power supply voltage.

The DSP functionality may be implemented as hardware or as firmware running on a CPU. The transmitter may be configured with parameters including operating frequency, the transmitter ID and modulation type via a data port 1224 to an external computer or programming device.

The complete transmitter 314 may be enclosed in a waterproof enclosure 1226 suitable for housing electronic equipment in an outdoor or underground environment. By using high efficiency switching devices for the half bridge and inside the AC/DC converter, the power dissipation inside the enclosure may be maintained at a low value. The enclosure may then be made small enough such that it may be integrated into the housing for antenna 312.

At the VLF frequencies that do not experience multipath reflections when penetrating solid barriers, the wavelength of the signal is very large, i.e., at approximately 4 kHz λ=75 km. The reactive near field zone of an antenna extends to λ/16 from the antenna, so the whole environment will be in the reactive near field zone of any antennas placed within it. Within this zone, the antenna does not significantly radiate an electromagnetic plane wave, as the magnetic field component is dominant. The magnetic field strength decays more rapidly than a plane wave, and is proportional to $1/d^3$, where d is the distance from the antenna. The magnetic field can be conveniently created by forcing a current around a small loop of wire, as described above. Modulating the current 1210 flowing through antenna 312 with data imposes the same modulation on the magnetic field 706; this may be demodulated by a distant receiver to recover the data.

The magnitude of the reactive magnetic field is determined by the Dipole Moment (DM) of the antenna 312, given by:

$$DM = A \cdot N \cdot I,$$ Equation 14 where, A is the area of the antenna, N is the number of turns and I is the current in the loop. The DM of the antenna determines the strength of the magnetic field within its coverage area, and hence the signal to noise ratio at the receiver input. Another factor that is considered in antenna placement is the amplitude slope of the magnetic field, as a large amplitude slope improves the position accuracy of the receiver for a given error in signal level measurement. In free space, the amplitude slope becomes less than 1 dB/m at distances greater than (>) approximately 30 m from the antenna, regardless of the magnitude of DM. However, in a conductive environment, the amplitude slope may flatten at closer distances. The current 1210 is determined by the resistance 1220 and inductance 1218 of the loop, the latter generally being the dominant factor and proportional to $N^2$.

In FIG. 10, a single Tx antenna 312 is shown for clarity. At least four such Tx antennas 312 are deployed in order to determine a position in three dimensions. These Tx antennas 312 can provide coverage through multiple floors 808 of the structure. However, to provide an accuracy of the order of approximately 1 m, a larger number of Tx antennas 312 is generally used, and the distance from any Tx antenna 312 is limited by the amplitude characteristic of the magnetic field 706. If this changes by less than approximately 1 dB/m, it can be difficult to provide a position accuracy of <1 m. This limits the effective range for position measurement to around approximately 30 m. In some embodiments, position coverage is provided throughout the building structure by placing Tx antennas 312 throughout the structure located no more than approximately 30 m apart. The Tx antennas 312 may be located on different levels. The Tx antenna coverage is verified for each cell in the model by comparing the signal levels predicted by the FDTD simulation model for each transmitter with a minimum signal level. The amplitude slopes from each transmitter 314 can also be determined by comparing the values in adjacent cells.

The transmitting antenna 312 may be deployed in the structure with the antenna dipole axis vertical and the wire loop suspended from the ceiling or buried in the floor. In this configuration, the antenna 312 may be several m on each side, and use one or two turns of wire to provide a range of approximately 30 m. Alternatively, they may be deployed with the antenna axis horizontal, and attached to the walls or to support post. For the horizontal axis antennas to be easily deployed, the area of the loop should be smaller, so a multi-turn loop is used. The current is determined by the impedance of the loop, which is proportional to $N^2$. In some embodiments, the transmit loop area may be approximately 1 m×1 m with N=10. The peak current with the transmitter supply voltage of 170V power supply is 14 A, giving a Dipole Moment of 140 $Am^2$. This is adequate to signal coverage over a 30 m range and through two levels of typical reinforced concrete.

In other embodiments, a single large Tx antenna 312 is placed around the perimeter of the building structure. This antenna 312 will create a large dipole moment, and provide coverage throughout the parking structure. However, the amplitude slope will flatten out with distance as for the smaller antennas 312, so it is used for accurate position measurement at a distance up to approximately 30 m away. Smaller loop antennas are placed inside it to provide the additional sources used for unambiguous position measurement.

Figure 13:
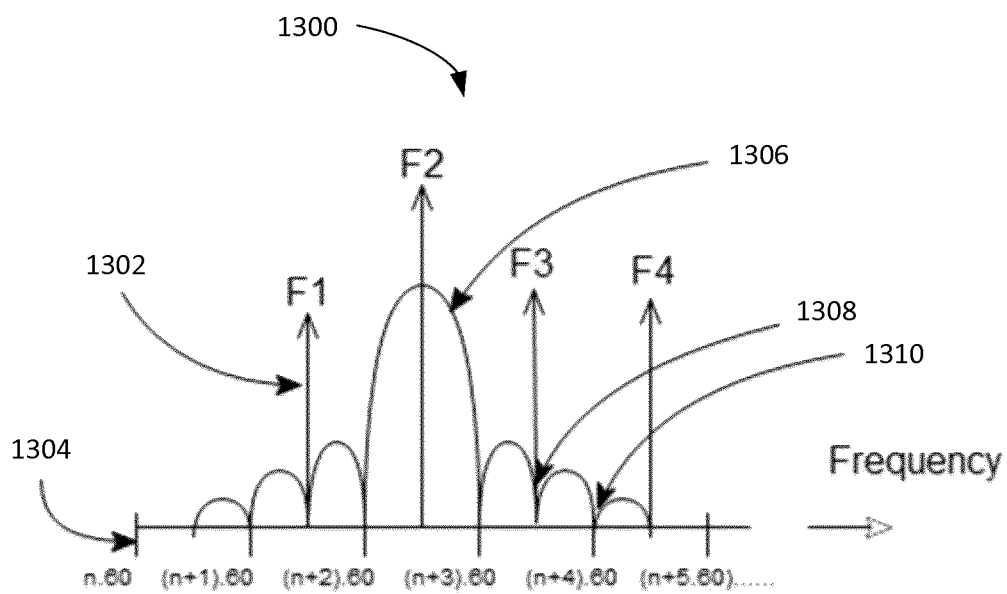
FIG. 13 illustrates, in a diagram, an example of a frequency multiplexing method for the MPS transmitters.

In order to separately resolve the magnetic field from each transmitter antenna 312, the transmissions are be multiplexed. In some embodiments, the transmitter signals may be frequency multiplexed, as illustrated by FIG. 13, which plots 1300 the signal field strength of a number of transmitters vs frequency. Each transmitter antenna 312 transmits at a separate center frequency 1302, in the VLF band, shown as F1, F2, F3 . . . Fn. Each transmitter may operate continuously and may be identified by the center frequency of transmission, avoiding the need to modulate the signal, since only an amplitude measurement is required to determine position. It is efficient to download large amounts of data, such as the building maps and map updates via vehicle to vehicle (V2V) or vehicle to infrastructure (V2I) data links which use conventional, high bandwidth radios 1518 operating at much higher radio frequencies (RF).

The unmodulated carriers have a very narrow bandwidth, so that narrow band filters can be used to detect them. The Goertzel algorithm may be used at the receiver to implement a narrow band filter for each transmitter frequency; for a small number of tones this provides a more efficient means of implementing a narrow band-pass filter than filters based on the Fast Fourier Transform (FFT). The Goertzel algorithm can be implemented in the form of a second order infinite impulse response (IIR) filter, and computes a single bin Discrete Fourier Transform (DFT) output. For position measurement in areas where man-made noise is present, the frequencies of the transmitters are arranged such that the center frequency is located at the mid-point between the AC power harmonic frequencies 1304 at n.50 Hz or n.60 Hz. For example, for a 60 Hz AC system, a transmitter may be operated at 4050 Hz, which is centered between the $67^{th}$ and $68^{th}$ harmonics of 60 Hz, with other transmitters operating at 3090 Hz and 4110 Hz. The bandwidth of the Goertzel filter may be set to one half the harmonic interval, i.e., 25 or 30 Hz. As illustrated in FIG. 13, with this frequency plan, the Goertzel filter output frequency response 1306 has the advantageous property of placing nulls at the center frequencies of both the adjacent transmitters 1308, and powerline noise 1310, thus providing a high attenuation for both unwanted signal sources.

A filter bin may also be placed at an unused interharmonic frequency in order to measure the background noise. Alternatively, the transmitter signals may be periodically blanked in order to make a noise measurement on each transmitter frequency. The filter bandwidth limits the response time of the system to changes in amplitude as the receiver moves. However, because the digital implementation of the Goertzel filter is very efficient, the signals from each transmitter can be processed in parallel in a low power DSP, so that the position update rate can be the same as the filter response time.

In other embodiments, each positioning transmitter may be modulated in order to send data to the receiver. The data can be modulated onto the transmitted magnetic field 706 using a number of modulation techniques. Simpler modulation methods such as frequency-shift keying (FSK), binary phase-shift keying (BPSK) or quadrature phase-shift keying (QPSK) are useable at a lower signal to noise ratio (SNR) than higher order modulation such as 64 QAM but take longer to send the data. If a multi-channel receiver is used the signals from each transmitter may be processed in parallel.

The frequency plan and filter shown in FIG. 13 can also be used if the signal is modulated, but the transmit waveform bandwidth should be constrained by limiting the modulation rate and filtering the waveform to ensure that that, at the minimum receiver signal level, a strong adjacent channel signal does not degrade the amplitude measurement of the weaker signal. The adjacent channel rejection of the receiver may be improved by increasing the frequency spacing between the transmitters. Frequency dependent effects on propagation may be incorporated into the FDTD simulation model by adjusting the frequency of the current excitation for each antenna.

Figure 14:
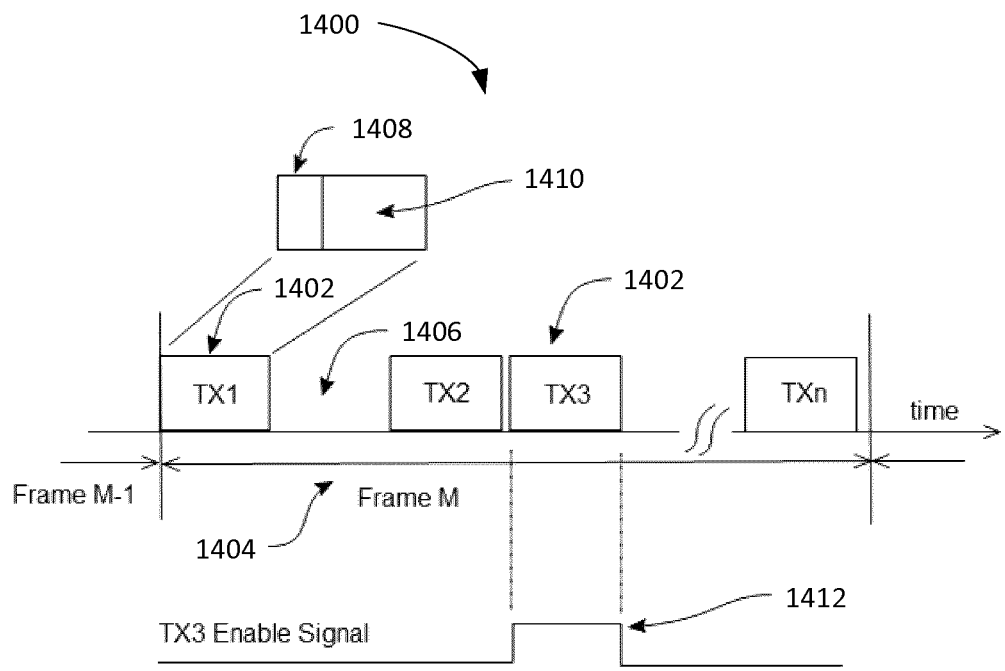
FIG. 14 illustrates, in a diagram, an example of a time division multiplexing method for the MPS transmitters.

In other embodiments, each transmitter signal is time multiplexed as shown in FIG. 14. In this configuration, each transmitter antenna 312 (Tx$_1$, Tx$_2$, ... Tx$_n$) operates at the same frequency but is only turned on in a specific timeslot 1402 within a transmission frame 1404. A null timeslot 1406 may be incorporated into the frame to allow the receiver to also measure the background noise and assist the synchronization process. The transmission within each timeslot comprises a synchronization word 1408 and a data packet which contains the unique identification code (ID) 1410 of the building structure and transmitter 314. The data 1410 may be encoded in order to detect or correct errors. In some embodiments, each transmitter 314 may use a unique synchronization word 1408, which can be used to recognize the transmitter 314.

In the time multiplexed configuration, the receiver signal processing may be reduced if the clocks used to generate the modulated waveform in each transmitter are be synchronized in frequency and in phase. In addition, each transmitter is synchronized to a specific timeslot in the frame. In some embodiments, synchronization may be implemented via timing pulses sent from a master transmitter to the other transmitters via data port 1224. In other embodiments, each transmitter 314 may be equipped with a receiver that allows it to detect and monitor the transmissions from a primary transmitter, and thus determine the transmitter frequency and phase, as well as frame timing.

In other embodiments, a single DSP 1204 may be used to generate the PWM signals in each timeslot. These signals are then routed to each of the different Tx antenna locations, together with an enable signal 1412 which is aligned with a specific timeslot 1402. The enable signal is active in a different timeslot for each antenna 312. At the antenna, driver 1212 and bridge circuits 1214 are enabled, for the duration of a specific timeslot, to convert the PWM signal for into the high current antenna signal 1210. It is not desirable to route the antenna currents over a long distance due to the power loss incurred in the cable and the risk of stray magnetic fields being created and causing position measurement errors.

In some embodiments, the system may use QPSK modulation at a rate of approximately 1000 S/s, so that if the frame has 8 timeslots of 12.5 ms each, the transmitter may send 12 symbols or 24 bits of data per frame to identify the transmitter and building location. Other types of modulation, including a multicarrier modulation such as Inter-Harmonic Modulation (IHM), which can operate at even lower SNR in the presence of power line harmonic noise, may also be used.

A complete frame is initially received in order to determine the field strength from all the transmitters in the environment. Subsequently, the position may be updated each time a new transmitter signal is received, providing a faster, rolling position update. The length of the timeslot, therefore, determines the maximum rate at which the receiver position can be updated. In the example for QPSK modulation given above, the maximum position update rate is then approximately 12.5 ms. A vehicle through the environment at 20 km/hr will travel 0.07 m in this period.

Figure 15:
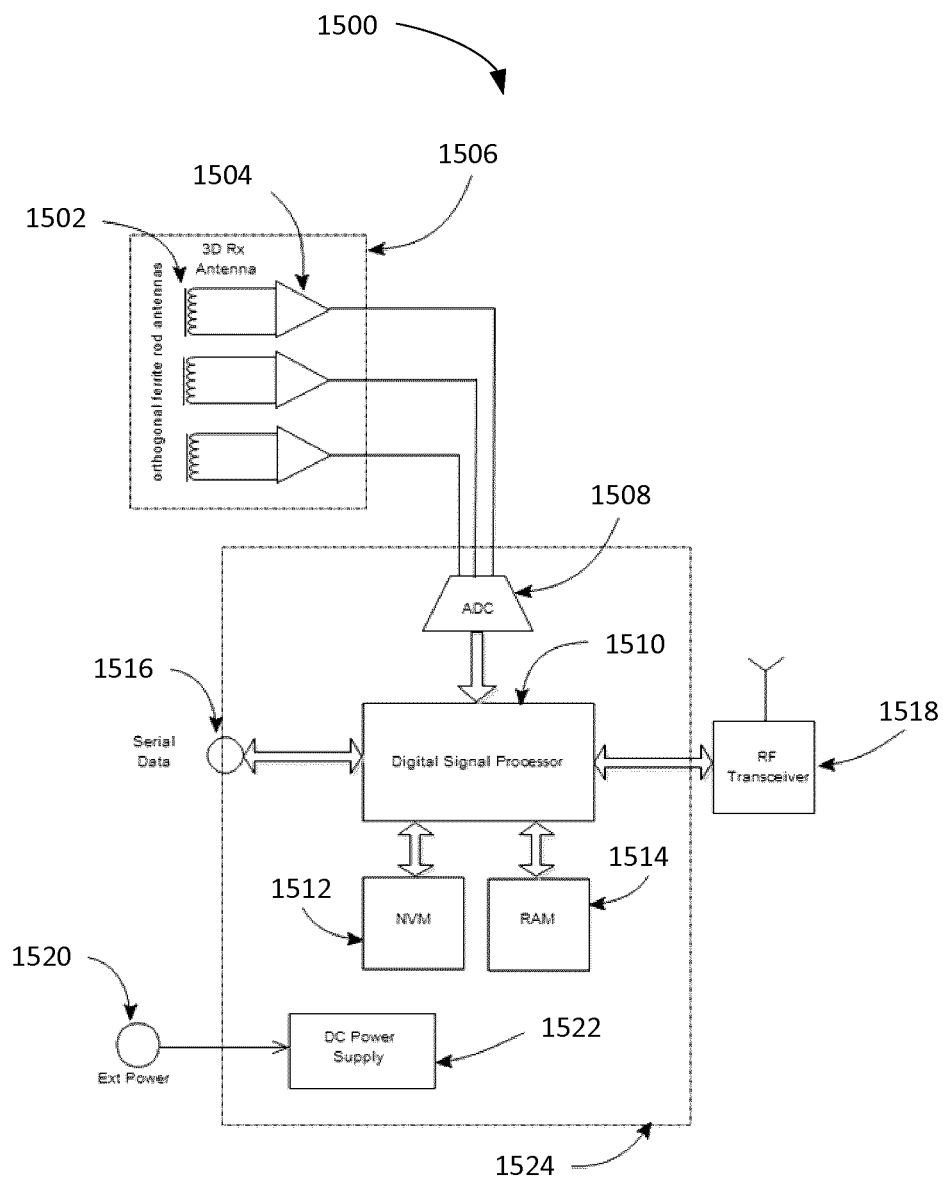
FIG. 15 illustrates, in a block diagram, an example of the MPS receive antenna and receiver according to some embodiments.

FIG. 15 illustrates an exemplary block diagram 1500 of the three-dimensional (3D) receiver (Rx) antenna 504 and positioning receiver 102. In some embodiments, the 3D Rx antenna 504 comprises three separate loop antennas 1502 mounted orthogonally so that the magnetic field can be received regardless of the Rx antenna orientation with respect to the transmitter antennas 312. The output from a loop antenna 1502 exposed to a time varying magnetic field is an electro-magnetic field (EMF) which is proportional to the magnitude of the field passing through the coil and its rate of change, as given by Faraday's law:

$$E=\mu \cdot A \cdot N \cdot (-dB/dt) \qquad \text{Equation 15}$$

where,
$\mu=\mu_o*\mu_r$, the effective permeability of the material inside the loop
A=the area of the loop
N=the number of turns in the loop
B=the magnetic flux density As shown in Equation 2, wire loop antennas have an output which is proportional to the frequency of the magnetic field. In positioning applications, this is beneficial as it reduces the antenna output at the fundamental and harmonic frequencies used for AC power distribution where the man-made noise is very high compared to in the rest of the frequency band. The sensitivity of a loop antenna is improved by using a loop with a large number of turns and a ferrite core. However, the effective value of the permeability of the core is limited to a value much lower than o$_r$, the relative permeability of the ferrite material unless the length is many times the diameter of the material. However, in order to fit conveniently into a vehicle, the antenna dimensions are compact. In some embodiments, the ferrite antennas 1502 may be approximately 18 cm long×1.2 cm diameter and wound with 2000 turns of wire.

Three of these antennas are arranged into a compact orthogonal array to sense the magnetic field simultaneously in three dimensions. The signal from each antenna 1502 has low amplitude (of the order of uV) and is amplified by one of three differential amplifiers 1504, preferably located in the same housing 1506 as the antennas 1502 to prevent unwanted noise being induced on the antenna output signal.

In other embodiments, a solid-state sensor may be used to detect the alternating magnetic fields generated by the transmitters 314. For example, sensors that are based on Tunneling MagnetoResistance (TMR) and Giant MagnetoInductance (GMI) use different types of quantum effects in semiconductor material to convert weak magnetic field into an EMF. These types of sensors generally have a flat frequency response and must be AC coupled to the differential amplifiers 1504. However, they are much smaller than ferrite antennas so that a complete 3-D Rx antenna 504 may be implemented within a volume of approximately 1 cm$^3$, or even inside a single integrated circuit (IC) package. The solid state 3-D Rx antenna 504 may then be more readily be co-located with other antennas mounted on a vehicle.

The complete receiver 102 may be calibrated by separately placing each receive antenna 1502 in a known magnetic field, and measuring the receiver output level. If necessary, the magnetic field is modulated with the transmitter waveform so that the receiver 102 is synchronized. A constant, known magnetic field strength may be generated inside a volume of space containing the antenna 1502 by a Helmholtz coil. The ratio of the magnetic field strength to signal level for each antenna may then be stored as a calibration factor in the receiver non-volatile memory (NVM) 1512.

The positioning receiver 102 comprises an analog to digital converter (ADC) 1508, a digital signal processor 1510, a non-volatile memory (NVM) 1512, a random-access memory (RAM) 1514 and a power supply 1522. The amplified signals from the 3D antenna are input to the ADC where they are sampled at a rate which is at least greater than 2 times the highest signal frequency to prevent aliasing. The dynamic range of the ADC 1508 must be able to accommodate the change in magnetic field when the vehicle is as close as approximately 1 m from a transmitter antenna or at maximum range. This may be achieved by using an ADC with a wide dynamic range, or alternatively by dynamically reducing the gain of the differential amplifiers 1504 in a timeslot, once the signal has exceeded a pre-determined threshold.

The sampled data is then sent to the digital signal processor 1510 which performs the functions of signal filtering, for example using a Goertzel filter, amplitude measurement and noise correction, in order to obtain an accurate measurement of the field strength received by each antenna 1502. The Pythagorean sum of the magnitude of these values is then calculated to determine the total field strength. The DSP 1510 may optionally incorporate synchronization and demodulation functions in order to receive data from the transmitters.

In some embodiments, the DSP 1510 may be implemented as firmware running on a CPU core. The DSP 1510 is connected to non-volatile memory 1512 which stores the constant values used to calculate the field strength, including the receiver and antenna calibration. The RAM 1514 may be used to store temporary values, such as the intermediate filter results, current receiver output signal level and SNR. As well as providing the receiver functions, the same DSP 1510 may be used to implement the positioning algorithm and non-volatile memory 1512 may also be used to store the FDTD model 510 of the environment. In other embodiments, DSP 1510 may be implemented in discrete hardware, or integrated onto a single hardware device such as an ASIC.

DSP 1510 may also be connected to a data port 1516, to allow specific configuration parameters used in the receiver or the positioning algorithms to be loaded into it. Such parameters may include the height above ground of the Rx antennas 1502 or the FDTD derived model 510 of the environment and associated spatial model. The serial port 1516 may also be used to output the measured field strength data or the estimated position of the receiver to the vehicle 708. The DSP 1510 may also be connected to a conventional RF transceiver 1518 which communicates via a vehicle-to-vehicle or vehicle to infrastructure network, in order to report the estimated position to an external process or to receive an updated model of the environment.

The receiver hardware may be supplied by a direct current (DC) power supply 1522, which converts power from an external source 1520 to the appropriate internal supply voltages. The external source may be a battery installed on vehicle 708. The DC power supply 1522 may also provide a low noise supply voltage to the differential Rx amplifiers 1504. The receiver hardware may be implemented on a single circuit card assembly and enclosed in a housing 1524 to protect it from the environment.

Figure 16:
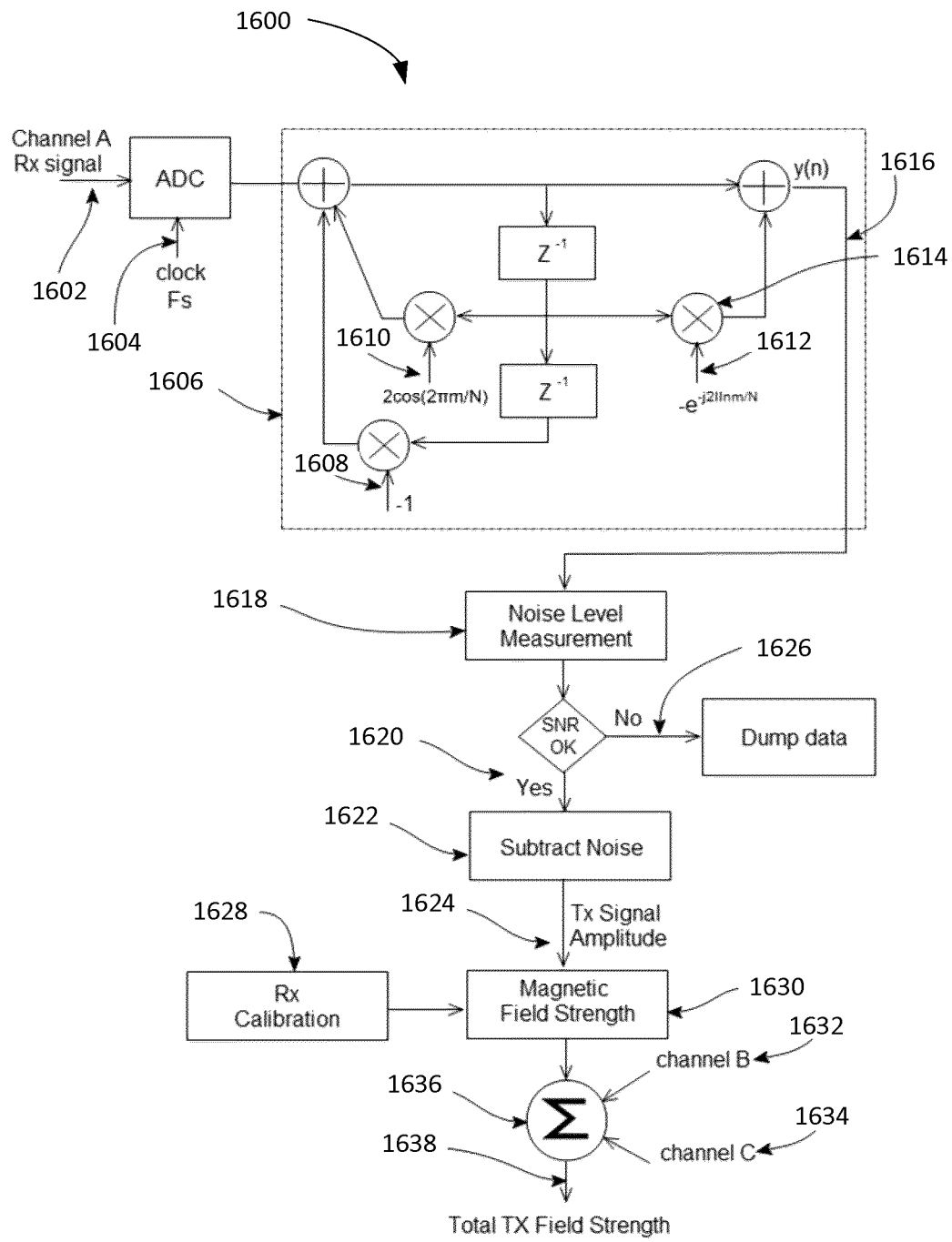
FIG. 16 illustrates, in a diagram, an example of the signal processing performed by the receiver.

FIG. 16 illustrates a data flow diagram 1600 that shows each step of the signal processing performed by the receiver to determine the amplitude of the magnetic field from a single narrow band transmitter using the Goertzel algorithm to implement a narrow band filter. The analog signal 1602 from one of the 3D Rx amplifiers, identified as channel A, is sampled by the ADC clock 1604. The sampling rate $F_s$ is made greater than the Nyquist rate and is ideally an integer multiple of each of the transmitted frequencies. The Goertzel algorithm is implemented in the form of a second-order IIR filter 1606, which has two real feedback coefficients 1608, 1610 and a complex feed-forward coefficient 1612. The filter computes a single-bin DFT output defined by:

$$X(m) = \Sum_{n=0}^{N-1} x(n) e^{-j2\pi nm/N}$$ Equation 16 where N is the block size of the filter and determines its bandwidth or frequency resolution. This is given by:

$$\text{Bandwidth} = \frac{F_s}{N}$$ Equation 17

For unmodulated positioning signals the bandwidth can be made small, improving the SNR of the receiver. This is advantageous when using solid state sensors that have higher internal noise than conventional ferrite rod antennas. However, the filter output is obtained after a block of N samples has been processed. The filter update rate is then the inverse of the filter bandwidth, i.e., for a bandwidth of 25 Hz, the output will only be updated every 0.04 seconds.

The filter uses a complex multiplication 1614 to generate the filter output 1616. As is known in the art, this can be implemented by splitting the coefficient and data into real and imaginary parts, performing a real multiply on each part and then re-combining the results. This is omitted from the diagram for clarity.

The filter output 1616 is then a time series of data values which are proportional to the magnitude of the received magnetic field for a given transmitter at the filter frequency. In step 1618, the signal to noise ratio (SNR) of the recovered data is then calculated based on the statistical properties of a series of amplitude measurements. In some embodiments, the SNR is estimated from the second and fourth moments of the signal amplitude. If the SNR is acceptable 1620, then in the next step 1622, the estimated level of additive noise is subtracted from the value obtained from the filter output to yield the transmitter signal amplitude 1624. If the SNR is too low 1626, the amplitude measurement is discarded. In other embodiments, the background noise may be measured periodically by turning off the transmitter for a period at least twice the filter delay time. In other embodiments a separate filter may be used to measure the background noise, tuned to an inter-harmonic frequency that is not used by any transmitters.

The receiver calibration 1628, which is stored in non-volatile memory is used to convert the symbol amplitude into a magnetic field strength 1630 for channel A, in the example shown.

The same process is performed in parallel for the other two antennas that form the 3D Rx antenna 504, shown as channel B 1632 and channel C 1634. In step 1636, the total magnetic field 1638 is then calculated as the vector sum of the three field components measured on each channel.

The position of the receiver is determined by comparing the signal levels from each transmitter with the FDTD derived model 510 of the environment. The allocation of transmitters is dependent on the geometry of parking garage and is determined on a site-specific basis. A receiver mounted on an autonomous vehicle will be able to sense signals from M transmitters—some of the total N transmitters may not be sensed because their signal has been attenuated too much. The amplitudes of the signals from M transmitters are measured and organized into a matrix T:

$$T = \begin{pmatrix} T_1 \\ T_2 \\ \vdots \\ T_M \end{pmatrix}.$$ Equation 18

In some embodiments, the FDTD model search area may be restricted to include only cells that correspond to the height of a vehicle mounted 3-axis antenna 504. This information together with other receiver configuration data, such as the receiver calibration data along with other may be stored in the receiver non-volatile memory 1512 at the time of installation. The map of the magnetic field is then a series of raster grids, each representing a level of the parking garage. Each cell of the raster grid contains a value of the magnetic field. Let G represent the set of magnetic maps for each transmitter:

$$\hat{G} = \begin{pmatrix} \dot{G}_1 \\ \dot{G}_2 \\ \vdots \\ \dot{G}_M \end{pmatrix}.$$

Equation 19

G^ is a subset of set G that contains only the maps for the transmitters sensed by the receiver:

$$G = \begin{pmatrix} G_1 \\ G_2 \\ \vdots \\ G_N \end{pmatrix}.$$

Equation 20

The contents of $\hat{G}$ are reorganized to give a vector B for each cell:

$$B = \begin{pmatrix} B_1 \\ B_2 \\ \vdots \\ B_M \end{pmatrix}.$$

Equation 21

The contents of B represent the set of observed magnetic fields at each possible cell. B is thus analogous to the vector T, where the former is the set of calculated magnetic fields and the latter is the set of observed magnetic fields. For each cell, the misfit D between T and B is calculated as an RMS difference between the two vectors:

$$D = \sqrt{\frac{\sum_{i=1}^{M}(B_i - T_i)^2}{M}}$$

Equation 22

From Equation 22, a new raster grid of each parking garage level is obtained, where each cell holds the misfit between the observation vector T and the vector B corresponding to the cell. In brief, cells with high misfits are unlikely to correspond to the correct position of the receiver, whereas cells with low misfits are likely to correspond to the correct position of the receiver.

One interpretation of the map of misfits is that the cell with the lowest misfit, i.e., the "best match" between the observed data and the raster map, corresponds to the position of the receiver. FIG. 17 illustrates a two-dimensional raster map 1700 showing the misfit value for each cell 1702 over a portion of one level of a parking garage 1704. The cell with lowest misfit 1706 is located near the center of the diagram.

The model of the magnetic field, however, has an inherent uncertainty as it derives from fitting a conductivity model to a set of magnetic field measurements, and a residual of objective functional to be minimized remains. This residual, given as a RMS value R, as output from the simulation model 914, represents the uncertainty of the calculated magnetic fields. Consequently, a related uncertainty exists for the position.

Consider the misfit R, which is the RMS difference between T and any B, and D, which is the RMS uncertainty in the calculated magnetic field. If, for any cell 1702 on the raster grid, R is greater than D, it is very unlikely that the cell represents the correct position, because there is a significant difference between T and B. The significance is quantified by R, which represents the limit where there is not enough of a difference to distinguish T and any B. The corollary is that if R is less than D, we cannot distinguish between T and B and thus the cell in question is a plausible position.

If all the cells where R<D are highlighted, an approximate ellipse is seen on the grid. By fitting an ellipse 1708 around approximately 95% of these cells, we obtain approximately a 95% confidence area as to where the receiver 102 can be located since we are certain that the correct position is not in the cells where R>D, and we cover 95% of cells where the correct position may be. In some cases, all R values may be persistently high—while not necessarily greater than D, they approach it. In such cases, the search misfit is scaled empirically. For example, if D=0.7, the default search is for R<0.7, whereas for high R values, the search might be updated to R<1.4. The justification for this scaling is because D is an overall uncertainty for the calculated magnetic field at every field. However, some areas of the grid might have higher individual differences. Without this scaling, even though R is high, the algorithm would return a misleadingly precise result. With the probable location of the receiver bounded by ellipse 1708, the position can be estimated from the coordinates of the center of the ellipse. In practice these coordinates are generally found to coincide with the cell 1706 having smallest R value. This cell position is the mapped onto the physical model of the environment to produce the geographic location of the Magnetic Positioning Receiver in a standardized GIS format. This process may be repeated at the update rate of the receiver to create real-time position information.

Figure 18A:
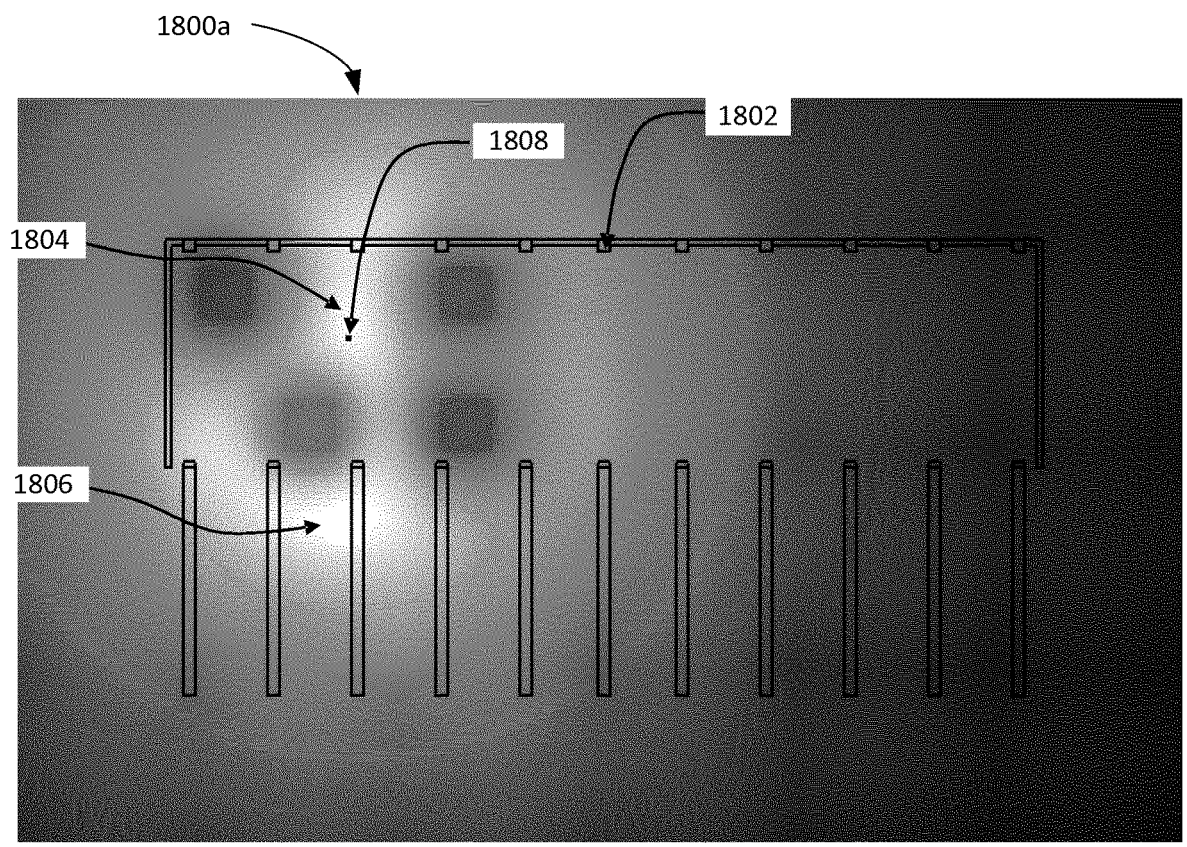
FIG. 18A illustrates the misfit function contours and calculated position in a parking garage using field strengths based on free space propagation.

FIG. 18A illustrates a plan view 1800a showing the misfit function plotted as gray scale contours 1802 for the signals from three transmitters located in a section of a parking garage where GNSS signals are blocked by the concrete structure. In this case the magnetic map is based on a free space propagation model. The misfit is plotted on a logarithmic grey scale covering a 40 dB range from 50 to 0.05. For the free space propagation model, there are two separate areas 1804, 1806 with low misfit. This ambiguity means that the position of the receiver whose actual location is shown at position 1808 cannot be resolved.

Figure 18B:
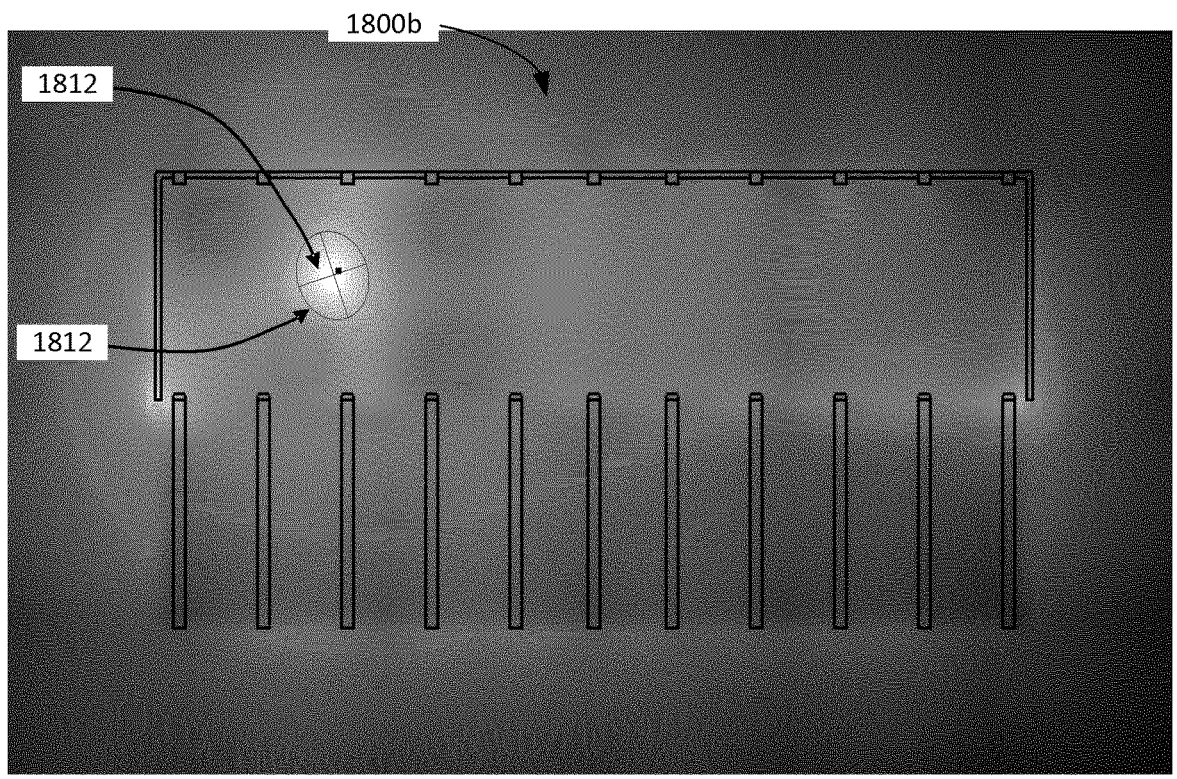
FIG. 18B illustrates the misfit function contours and calculated position in a parking garage using the FDTD model.

FIG. 18B illustrates the same parking structure, and is plotted 1800b using the same observed data, but in this case the magnetic map was derived using an FDTD simulation, with the building conductivity values derived through inversion of previous sample test data. In this case a single area of low misfit 1810 is obtained. The center of the ellipse 1812 that covers approximately 95% of the possible cells in this area is within approximately 0.8 m of the actual location.

In some embodiments, the MPR resources are used to perform the position and probability estimate and the geographic location may be reported to the vehicle via data port 1516 where it may be used to verify the vehicle location and, together with inputs from other sensors, to assist it in navigating through the conductive environment. The position information may also be reported to a local controller over a wireless communications link 1520, via transceiver 1518 where it may be used for other purposes, for example, to alert pedestrians of a nearby moving vehicle. The position information may also be reported up to a system wide vehicle management network, for example in order to report the vehicle position to other vehicles. The wireless communication link 1520 can be implemented at a conventional RF frequency. This link can be implemented with a large fade margin, or use MIMO antennas to combat multipath inside the conductive environment, since it is only used to transmit data and not to provide a position estimate.

In other embodiments, the MPR computing resources are only used to calculate the field strength values from the transmitters within range. These values are then sent over the data link 1520 via transceiver 1518 and network 1522 to a remote processor 1524 which also contains the map data. This configuration avoids the need for the mobile receiver to store and maintain the magnetic map information.

While illustrated in the diagrams as groups of discrete components communicating with each other via distinct data signal connections, it will be understood by those skilled in the art that the present embodiments are provided by a combination of hardware and software components, with some components being implemented by a given function or operation of a hardware or software system, and many of the data paths illustrated being implemented by data communication within a computer application or operating system. The structure illustrated is thus provided for efficiency of teaching the present embodiment. The present invention can be carried out as a method and can be embodied in a system or on a computer readable medium. The embodiments of the invention described above are intended to be exemplary only.

The embodiments of the devices, systems and methods described herein may be implemented in a combination of both hardware and software. These embodiments may be implemented on programmable computers, each computer including at least one processor, a data storage system (including volatile memory or non-volatile memory or other data storage elements or a combination thereof), and at least one communication interface.

Program code is applied to input data to perform the functions described herein and to generate output information. The output information is applied to one or more output devices. In some embodiments, the communication interface may be a network communication interface. In embodiments in which elements may be combined, the communication interface may be a software communication interface, such as those for inter-process communication. In still other embodiments, there may be a combination of communication interfaces implemented as hardware, software, and combination thereof.

Embodiments may relate to servers, services, interfaces, portals, platforms, or other systems formed computing devices having at least one processor configured to execute software instructions stored on a computer readable tangible, non-transitory medium. For example, a server can include one or more computers operating as a web server, database server, or other type of computer server in a manner to fulfill described roles, responsibilities, or functions.

Various example embodiments are described herein. Although each embodiment represents a single combination of inventive elements, all possible combinations of the disclosed elements include the inventive subject matter. Thus, if one embodiment comprises elements A, B, and C, and a second embodiment comprises elements B and D, then the inventive subject matter is also considered to include other remaining combinations of A, B, C, or D, even if not explicitly disclosed.

The term "connected" or "coupled to" may include both direct coupling (in which two elements that are coupled to each other contact each other) and indirect coupling (in which at least one additional element is located between the two elements).

The technical solution of embodiments may be in the form of a software product. The software product may be stored in a non-volatile or non-transitory storage medium, which can be a compact disk read-only memory (CD-ROM), a USB flash disk, or a removable hard disk. The software product includes a number of instructions that enable a computer device (personal computer, server, or network device) to execute the methods provided by the embodiments.

The embodiments described herein are implemented by physical computer hardware, including computing devices, servers, receivers, transmitters, processors, memory, displays, and networks. The embodiments described herein provide useful physical machines and particularly configured computer hardware arrangements. The embodiments described herein are directed to electronic machines and methods implemented by electronic machines adapted for processing and transforming electromagnetic signals which represent various types of information.

What is claimed is:

1. A magnetic positioning system for an environment that includes conducting material, the magnetic positioning system comprising:
    at least one very low frequency (VLF) magnetic field transmitter;
    a VLF receiver configured to:
        detect magnetic fields transmitted from the at least one VLF magnetic field transmitter; and
        estimate a total magnetic field strength from the at least one VLF magnetic field transmitter;
    a first processor configured to generate a 3-dimensional model of magnetic fields transmitted by the at least one VLF transmitter, the first processor configured to:
        perform a finite difference time domain (FDTD) simulation of electrical properties of the environment and the at least one VLF transmitter to generate a database of magnetic fields for each cell in the 3-dimensional model;
    a second processor configured to determine a location of the VLF receiver, the second processor configured to:
        compare measured magnetic field strengths to the field strengths in the database;
        determine which cell in the FDTD simulation has a least misfit to the measured data; and
        relate the FDTD model cell location to a physical map location in the environment.

2. The system of claim 1, wherein the first processor configures the FDTD simulation based on a uniform cell size with a conductivity value assigned to each cell to model electrical properties of the structure.

3. The system of claim 1, further comprising a test transmitter and calibrated receiver, both configured to make a number of field strength measurements at different locations inside the environment; wherein the data is used to fit a conductivity model of the environment using FDTD simulation by aligning the observed and calculated magnetic field strengths.

4. The system of claim 1, wherein the VLF receiver comprises a memory for storing a separate FDTD model for each of multiple environments.

5. The system of claim 1, where the FDTD model for a particular environment is downloaded to the VLF receiver at an entrance to the environment.

6. The system of claim 1, wherein the second processor is configured to remove a noise component in a signal level estimate based on using statistical properties of demodulated symbols to determine the magnetic field strength.

7. The system of claim 6, where the statistical properties include second and fourth moments of the demodulated symbols.

8. The system of claim 1, wherein the second processor is configured to remove a noise component in a signal level estimate using a direct measurement of background noise to determine the magnetic field strength.

9. The system of claim 1, wherein the second processor is configured to determine the position as the model cell with the smallest misfit between the signal amplitudes received from the at least one VLF magnetic transmitter and FDTD derived model values.

10. The system of claim 9, wherein the second processor is configured to constrain the misfit calculation to search only for cells with vertical offsets corresponding to a VLF receiver antenna height at different locations in the environment.

11. The system of claim 9, wherein the second processor is configured to minimize the misfit in a given environment by adjusting the a VLF receiver calibration.

12. The system of claim 9, wherein the second processor is configured to increase the position resolution by using a field strength gradient to determine a location of minimum misfit within the cell.

13. The system of claim 12, wherein the gradients are calculated from the field strengths of the surrounding cells in the FDTD derived model.

14. The system of claim 1, wherein the VLF receiver position is determined by fitting an ellipse around cells with a misfit below a chosen tolerance, such that the area of the ellipse encloses all possible locations of the VLF receiver with a known probability and the center of the ellipse gives the best estimate of the receiver position.

15. The system of claim 1, wherein the VLF receiver position is estimated to be a centre cell of a grouping of cells having a misfit value below a tolerance.

16. The system of claim 1, wherein transmissions from each VLF magnetic field transmitter are time multiplexed.

17. The system of claim 16 wherein each of the at least one VLF magnetic field transmitter is coupled to a transmit antenna, and each transmit antenna is driven by a single time-multiplexed waveform and enabled during an active timeslot.

18. The system of claim 17, wherein VLF magnetic field transmitter frequencies are located between the harmonic frequencies of AC powerline noise.

19. The system of claim 17, wherein VLF magnetic field transmitter frequencies are isolated in the VLF receiver using a Goertzel algorithm to implement a narrow band filter.

20. The system of claim 19, where the bandwidth of a Goertzel filter is one half the powerline frequency, such that the filter nulls are aligned with the frequencies of the other transmitters and AC harmonics.

21. The system of claim 20, where the VLF receiver sends signal level information via a network to an external digital signal processor configured to determine the location of the VLF receiver, the external digital signal processor configured to:
    compare the measured magnetic fields to the field strengths in the database;
    determine which cell in the FDTD simulation model has the least misfit to the measured data; and
    relate the FDTD model cell location to a physical map location in the environment.

22. The system of claim 1, wherein a signal transmitted by the at least one VLF transmitter is modulated using Inter-harmonic modulation.

23. The system of claim 1, wherein the second processor is configured to combine the location of the VLF receiver with other sensor data to allow a vehicle to navigate autonomously through the environment.

24. The system of claim 1, wherein the second processor is configured to transmit the location of the VLF receiver to a network.

25. The system of claim 1, wherein each of the at least one VLF magnetic field transmitter is coupled to a transmit antenna, and each transmit antenna is driven by a separate VLF magnetic field transmitter, said VLF magnetic field transmitters being synchronized to a master timing frame by a wireless receiver or a signal conducted over a cable.

26. The system of claim 1, where the VLF magnetic field transmitters are frequency multiplexed.

27. A method for determining the conductivity of elements of a man-made structure environment, the method comprising;
    creating a physical model of the environment based on a uniform cell size with a conductance value assigned to each cell to model the electrical properties of the structure;
    setting up a VLF transmitter in the environment, and obtaining a number, N, of measurements of the received field strength from the transmitter at known locations, the measurements including observed field strengths; assigning a number, M, of initial conductivity values to the major features of the structure, wherein M<N;
    performing an FDTD simulation to create a model of the magnetic fields within the structure, the model including simulated field strengths; and
    optimizing the conductivity values to minimize a misfit between simulated field strengths and the observed field strengths.

28. The method of claim 27, wherein the optimization is performed using a gradient search method.

29. The method of claim 27, wherein the optimization is repeated using different initial conductivity values.

30. The method of claim 27, wherein the residual misfit in the model, R is stored together with the derived conductivity parameters.

31. A method for determining a position within an environment including conducting materials, the method comprising;
    creating a model based on an FDTD simulation of magnetic fields within the environment created by at least one VLF magnetic field transmitter;
    measuring the total field strength from at least three of said at least one VLF magnetic transmitter;
    comparing the measured field strengths with values stored in the FDTD simulation model signals modulating the data;

determining a VLF receiver position to be the cell within the model which has a minimum misfit with the measured data; and mapping the cell onto a physical map of the environment.

32. The method of claim 31, wherein the FDTD simulation is based on a uniform cell size with a conductance value assigned to each cell.

33. The method of claim 31, wherein the FDTD simulation conductivity values are optimized to match data obtained using a test VLF transmitter performing a number of field strength measurements at different locations inside the environment.

34. The method of claim 31, wherein a VLF receiver memory stores the FDTD simulation for different environments.

35. The method of claim 31, wherein the FDTD simulation for an environment is downloaded to the VLF receiver prior to entering the environment.

36. The method of claim 31, wherein a noise component in a signal level estimate is removed based on using statistical properties of demodulated symbols to determine the magnetic field strength.

37. The method of claim 36, wherein the statistical properties of the demodulated symbols are second and fourth moments.

38. The method of claim 31, wherein a noise component in the signal level estimate is removed using a direct measurement of background noise to determine the magnetic field strength.

39. The method of claim 31, wherein the VLF receiver position is based on the minimum misfit between signal amplitudes received from the at least one VLF transmitter and the FDTD derived model.

40. The method of claim 31, wherein a misfit calculation is constrained to search only for cells with vertical offsets corresponding to a height of a VLF receiver antenna.

41. The method of claim 31, wherein the VLF receiver position is determined by fitting an ellipse around cells with a misfit below a chosen tolerance, and where the center of the ellipse gives the calculated receiver position and the orientation of the ellipse and the area of the ellipse indicates the location of the VLF receiver with a known probability.

42. The method of claim 31, wherein the VLF receiver position is estimated to be a centre cell of a grouping of cells having a misfit value below a tolerance.

43. The method of claim 31, wherein the VLF receiver position is combined with other sensor data to enable a vehicle to navigate autonomously through the environment.

44. The method of claim 31, where the receiver position is transmitted to a network.

45. A magnetic positioning system, the magnetic positioning system comprising:

a VLF receiver configured to:
  detect a magnetic field transmitted from a VLF magnetic field transmitter; and
  estimate a total magnetic field strength from the VLF magnetic field transmitter; and
a processor communicatively coupled to the VLF receiver, the processor configured to:
  generate a 3-dimensional model of the magnetic field transmitted by the VLF transmitter; and
  determine a location of the VLF receiver;
wherein to generate the 3-dimensional model, the processor is configured to perform a finite difference time domain (FDTD) simulation to generate a database of magnetic fields for each cell in the 3-dimensional model based on the electrical properties of the environment and the VLF transmitter.

46. The magnetic positioning system of claim 45, wherein to determine the location of the VLF receiver, the processor is configured to:
  compare measured magnetic field strengths to the field strengths in the database;
  determine which cell in the FDTD simulation has a least misfit to the measured data; and
  relate the FDTD model cell location to a physical map location in an environment including conducting material.

47. The magnetic positioning system of claim 45, further comprising a three-axis receiver antenna connected to the VLF receiver.

48. A method of generating a three-dimensional (3-D) model of an environment including conductive material, the method comprising:
  detecting, at a VLF receiver, magnetic fields transmitted from at least one VLF magnetic field transmitter;
  estimating, at the VLF receiver, a total magnetic field strength from the at least one VLF magnetic field transmitter; and
  generating, at the processor communicatively coupled to the VLF receiver, a 3-D model of magnetic fields transmitted by the at least one VLF transmitter;
  wherein the generating of the 3-dimensional model comprises:
    performing, at the processor, a finite difference time domain (FDTD) simulation to generate a database of magnetic fields for each cell in the 3-D model based on the electrical properties of the environment and the at least one VLF transmitter.

49. A method of determining a location of an object in an environment including conductive material, the method comprising:
  receiving, at a VLF receiver coupled to the object, a three-dimensional model of the environment; and
  determining, at a processor coupled to the VLF receiver, a location of the VLF receiver based on the 3-D model;
  wherein the determining of the location of the VLF receiver comprises:
    comparing, at the processor, measured magnetic field strengths to the field strengths in the database;
    determining, at the processor, which cell in the FDTD simulation has a least misfit to the measured data; and
    relating the FDTD model cell location to a physical map location in an environment including conducting material.

50. A non-transitory computer-readable storage medium comprising computer-executable instructions for causing a processor to:
  create a physical model of the environment based on a uniform cell size with a conductance value assigned to each cell to model the electrical properties of the structure;
  set up a VLF transmitter in the environment, and obtaining a number, N, of measurements of the received field strength from the transmitter at known locations, the measurements including observed field strengths;
  assign a number, M, of initial conductivity values to the major features of the structure, wherein M<N;
  perform an FDTD simulation to create a model of the magnetic fields within the structure, the model including simulated field strengths; and optimize the conductivity values to minimize a misfit between simulated field strengths and the observed field strengths.

\* \* \* \* \*